(12) United States Patent
Lee et al.

(10) Patent No.: US 12,295,201 B2
(45) Date of Patent: May 6, 2025

(54) MULTILAYER ELECTRODE, LIGHT-EMITTING DIODE INCLUDING THE SAME, AND DISPLAY APPARATUS

(71) Applicant: Samsung Display Co., Ltd., Yongin-si (KR)

(72) Inventors: Hakchoong Lee, Yongin-si (KR); Yoonseok Ka, Yongin-si (KR); Dongchan Kim, Yongin-si (KR); Jiyoung Moon, Yongin-si (KR); Hajin Song, Yongin-si (KR); Jihwan Yoon, Yongin-si (KR); Jaehoon Hwang, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 508 days.

(21) Appl. No.: 17/838,462

(22) Filed: Jun. 13, 2022

(65) Prior Publication Data

US 2023/0064765 A1 Mar. 2, 2023

(30) Foreign Application Priority Data

Sep. 2, 2021 (KR) .................. 10-2021-0117201

(51) Int. Cl.
*H10K 102/00* (2023.01)
*H10K 50/826* (2023.01)
*H10K 59/123* (2023.01)

(52) U.S. Cl.
CPC ......... *H10K 50/826* (2023.02); *H10K 59/123* (2023.02); *H10K 2102/351* (2023.02)

(58) Field of Classification Search
CPC ............... H10K 50/826; H10K 59/123; H10K 2102/351; H10K 59/1315; H10K 59/80524; H10K 2102/3026; H10K 50/82; H10K 50/81
See application file for complete search history.

(56) References Cited

U.S. PATENT DOCUMENTS

| | | |
|---|---|---|
| 8,018,137 B2 | 9/2011 | Shimoji et al. |
| 8,648,334 B2 | 2/2014 | Forsythe et al. |
| 9,949,336 B2 | 4/2018 | Yoon et al. |
| 2012/0248418 A1 | 10/2012 | Kim et al. |

FOREIGN PATENT DOCUMENTS

| | | |
|---|---|---|
| CN | 101194378 | 6/2008 |
| CN | 102738194 | 7/2015 |
| KR | 10-2008-0010455 | 1/2008 |
| KR | 10-2010-0013521 | 2/2010 |
| KR | 10-1458402 | 11/2014 |
| KR | 10-1632087 | 6/2016 |
| KR | 10-1875740 | 7/2018 |
| KR | 10-1918712 | 11/2018 |

*Primary Examiner* — Elias Ullah
(74) *Attorney, Agent, or Firm* — KILE PARK REED & HOUTTEMAN PLLC

(57) ABSTRACT

A display apparatus includes a first electrode on a substrate, a second electrode facing the first electrode, and an emission layer between the first electrode and the second electrode, wherein the second electrode includes a first conductive layer including a first base metal and a first additive metal that is different from the first base metal, a second conductive layer on the first conductive layer and including a single metal material, and a third conductive layer on the second conductive layer and including a second base metal and a second additive metal that is different from the second base metal.

28 Claims, 11 Drawing Sheets

FIG. 9

| | | MEASURED VALUE RAW DATA | | | | COMPARISON WITH REF. | | |
|---|---|---|---|---|---|---|---|---|
| | | COMPARATIVE EXAMPLE (AgMg 100 Å) (Ref.) | EMBODIMENT | | | EMBODIMENT | | |
| | | | EMBODIMENT 1 (10/40/10 Å) | EMBODIMENT 2 (10/60/10 Å) | EMBODIMENT 3 (10/80/10 Å) | EMBODIMENT 1 (10/40/10 Å) | EMBODIMENT 2 (10/60/10 Å) | EMBODIMENT 3 (10/80/10 Å) |
| T | 450nm | 63.9 | 65.5 | 64 | 59.4 | 1.6% | 0.1% | -4.5% |
| | 540nm | 77.4 | 79.4 | 78 | 73.3 | 2.0% | 0.6% | -4.1% |
| | 640nm | 76.6 | 78.2 | 74.8 | 68.2 | 1.6% | -1.8% | -8.4% |
| R | 450nm | 21.4 | 20.6 | 22.2 | 25.9 | -0.8% | 0.8% | 4.5% |
| | 540nm | 8.7 | 8.5 | 10.1 | 13.8 | -0.2% | 1.4% | 5.1% |
| | 640nm | 8.8 | 9.3 | 12.8 | 18.8 | 0.5% | 4.0% | 10.0% |
| A | 450nm | 14.7 | 13.9 | 13.8 | 14.7 | -0.8% | -0.9% | 0.0% |
| | 540nm | 13.9 | 12.1 | 12 | 12.9 | -1.8% | -1.9% | -1.0% |
| | 640nm | 14.6 | 12.5 | 12.5 | 13.1 | -2.1% | -2.1% | -1.5% |

FIG. 14

|  | B EFFICIENCY | G EFFICIENCY | R EFFICIENCY | EFFICIENCY |
|---|---|---|---|---|
| (COMPARATIVE EXAMPLE) Ref. Ag:Mg (100Å) | 29.9 | 21.9 | 1.6 | 53.4 |
| (EMBODIMENT 1) Ag:Mg/Ag/Ag:Mg (10/40/10Å) | 31.0 | 22.3 | 1.8 | 55.1 (+3.2%) |
| (EMBODIMENT 2) Ag:Mg/Ag/Ag:Mg (10/60/10Å) | 30.5 | 23.0 | 1.8 | 55.3 (+3.6%) |
| (EMBODIMENT 3) Ag:Mg/Ag/Ag:Mg (10/80/10Å) | 30.2 | 22.7 | 1.8 | 54.9 (+2.8%) |
| (EMBODIMENT 4) Ag:Mg/Ag/Ag:Mg (10/100/10Å) | 29.9 | 22.0 | 1.6 | 53.8 (+0.7%) |
| (EMBODIMENT 5) Ag:Mg/Ag/Ag:Mg (10/120/10Å) | 29.7 | 22.1 | 1.6 | 53.4 (=) |

FIG. 15

|  | B EFFICIENCY | G EFFICIENCY | R EFFICIENCY | EFFICIENCY |
|---|---|---|---|---|
| (COMPARATIVE EXAMPLE 1) Ref. Ag:Mg, Mg, 5% (100Å) | 29.9 | 21.9 | 1.6 | 53.4 |
| (EMBODIMENT 2) Ag:Mg/Ag/Ag:Mg (10/60/10Å) | 30.5 | 23.0 | 1.8 | 55.3 (+3.6%) |
| (EMBODIMENT 3) Ag:Mg/Ag/Ag:Mg (10/80/10Å) | 30.2 | 22.7 | 1.8 | 54.9 (+2.8%) |
| (COMPARATIVE EXAMPLE 2) Mg:Ag, Ag 10% (100Å) | 28.6 | 21.0 | 1.4 | 51.0 (-4.5%) |
| (COMPARATIVE EXAMPLE 3) Mg:Ag/Ag/Mg:Ag (10/60/10Å) | 29.7 | 21.9 | 1.6 | 53.2 (-0.4%) |
| (COMPARATIVE EXAMPLE 4) Mg:Ag/Ag/Mg:Ag (10/80/10Å) | 29.4 | 21.6 | 1.5 | 52.5 (-1.7%) |

MULTILAYER ELECTRODE, LIGHT-EMITTING DIODE INCLUDING THE SAME, AND DISPLAY APPARATUS

CROSS-REFERENCE TO RELATED APPLICATION(S)

This application claims priority to and benefits of Korean Patent Application No. 10-2021-0117201 under 35 U.S.C. § 119, filed on Sep. 2, 2021 in the Korean Intellectual Property Office, the entire contents of which are incorporated herein by reference.

BACKGROUND

1. Technical Field

Embodiments relate to a multilayer electrode having low driving voltage, high efficiency, and long lifespan, a light-emitting diode including the multilayer electrode, and a display apparatus including the light-emitting diode.

2. Description of the Related Art

Among display apparatuses, an organic light-emitting display apparatus is a next generation display apparatus not only due to its wide viewing angle and superior contrast, but also due to its fast response speed.

In an organic light-emitting display apparatus, thin-film transistors and light-emitting diodes (for example, organic light-emitting elements) are arranged on a substrate and the light-emitting diodes emit light by themselves. The organic light-emitting display apparatus is used as a display unit of a small product such as a mobile phone, and is also used as a display unit of a large product such as a television.

A light-emitting diode may have a structure in which a first electrode (e.g., an anode) is arranged on a substrate, and a hole transport region, an emission layer, an electron transport region, and a second electrode (e.g., a cathode) are sequentially formed on the first electrode. Holes injected from the first electrode move to the emission layer via the hole transport region, and electrons injected from the second electrode move to the emission layer via the electron transport region. Carriers such as holes and electrons recombine in an emission layer region to generate excitons. Light is generated as these excitons change from an excited state to a ground state.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a light-emitting diode having low driving voltage, high efficiency, and long lifespan, and a display apparatus including the light-emitting diode. However, the embodiments do not limit the scope of the disclosure.

Additional aspects will be set forth in part in the description which follows and, in part, will be apparent from the description, or may be learned by practice of the embodiments of the disclosure.

According to embodiments, a display apparatus may include a first electrode on a substrate, a second electrode facing the first electrode, and an emission layer between the first electrode and the second electrode, wherein the second electrode may include a first conductive layer including a first base metal and a first additive metal that is different from the first base metal, a second conductive layer on the first conductive layer and including a single metal material, and a third conductive layer on the second conductive layer and including a second base metal and a second additive metal that is different from the second base metal.

In an embodiment, the first base metal may include at least one of Ag, Au, Cu, Al, Mg, and a metal having an electrical conductivity equal to or greater than about $1\times10^7$ S/m.

In an embodiment, the first additive metal may include at least one of Mg, Ca, Li, Au, Al, Yb, Cu, Sm, and a metal having a work function equal to or less than about 3 eV.

In an embodiment, the single metal material may include at least one of Ag, Au, Cu, Al, Mg, and a metal having an electrical conductivity equal to or greater than about $1\times10^7$ S/m.

In an embodiment, a thickness of the first conductive layer may be less than a thickness of the second conductive layer.

In an embodiment, a thickness of the first conductive layer may be in a range of about 5 Å to about 30 Å.

In an embodiment, a thickness of the second conductive layer may be in a range of about 40 Å to about 120 Å.

In an embodiment, the second electrode may have stacked structures each including the first conductive layer and the second conductive layer.

In an embodiment, a volume ratio of the first base metal to the first additive metal may be in a range of about 99:1 to about 1:1.

In an embodiment, the second base metal may include at least one of Ag, Au, Cu, Al, Mg, and a metal having an electrical conductivity equal to or greater than about $1\times10^7$ S/m.

In an embodiment, the second additive metal may include at least one of Mg, Ca, Li, Au, Al, Yb, Cu, Sm, and a metal having a work function equal to or less than about 3 eV.

In an embodiment, the third conductive layer may include a same material as the first conductive layer.

In an embodiment, a thickness of the first conductive layer may be less than a thickness of the third conductive layer.

In an embodiment, a thickness of the third conductive layer may be in a range of about 5 Å to about 30 Å.

In an embodiment, a volume ratio of the second base metal to the second additive metal may be in a range of about 99:1 to about 1:1.

In an embodiment, a thickness ratio of the first conductive layer to the second conductive layer to the third conductive layer may be about 1:6:1.

According to embodiments, a light-emitting diode may include a first electrode, a second electrode facing the first electrode, and an emission layer between the first electrode and the second electrode, wherein the second electrode may include a first conductive layer including a first base metal and a first additive metal that is different from the first base metal, a second conductive layer on the first conductive layer and including a single metal material, and a third conductive layer on the second conductive layer and including a second base metal and a second additive metal that is different from the second base metal.

In an embodiment, the first base metal may include at least one of Ag, Au, Cu, Al, Mg, and a metal having an electrical conductivity equal to or greater than about $1 \times 10^7$ S/m.

In an embodiment, the first additive metal may include at least one of Mg, Ca, Li, Au, Al, Yb, Cu, Sm, and a metal having a work function equal to or less than about 3 eV.

In an embodiment, a thickness of the first conductive layer may be less than a thickness of the second conductive layer.

In an embodiment, a volume ratio of the first base metal to the first additive metal may be in a range of about 99:1 to about 1:1.

In an embodiment, the second base metal may include at least one of Ag, Au, Cu, Al, Mg, and a metal having an electrical conductivity equal to or greater than about $1 \times 10^7$ S/m.

In an embodiment, the second additive metal may include at least one of Mg, Ca, Li, Au, Al, Yb, Cu, Sm, and a metal having a work function equal to or less than about 3 eV.

In an embodiment, a thickness of the first conductive layer may be less than a thickness of the third conductive layer.

In an embodiment, a volume ratio of the second base metal to the second additive metal may be in a range of about 99:1 to about 1:1.

In an embodiment, the single metal material may include at least one of Ag, Au, Cu, Al, Mg, and a metal having an electrical conductivity equal to or greater than about $1 \times 10^7$ S/m.

In an embodiment, a thickness ratio of the first conductive layer to the second conductive layer to the third conductive layer may be about 1:6:1.

According to embodiments, a multilayer electrode may include a first conductive layer including a first base metal and a first additive metal that is different from the first base metal, a second conductive layer on the first conductive layer and including a single metal material, and a third conductive layer on the second conductive layer and including a second base metal and a second additive metal that is different from the second base metal.

The above and other aspects, features, and advantages of the embodiments of the disclosure will be more apparent from the following description, the accompanying drawings, and the claims.

These aspects may be implemented by using a system, a method, a computer program, or a combination of a certain system, method, and computer program.

BRIEF DESCRIPTION OF THE DRAWINGS

The above and other aspects, features, and advantages of the embodiments of the disclosure will be more apparent from the following description taken in conjunction with the accompanying drawings, in which:

FIG. 9 is a table obtained by measuring light transmittance, reflectance, and absorption rate for a multilayer electrode to which an embodiment of the disclosure is applied and a multilayer electrode to which a comparative example is applied;

FIG. 14 is a table comparing the pixel efficiency of a comparative example to the pixel efficiencies of embodiments of the disclosure; and FIG. 15 is a table comparing the pixel efficiencies of comparative examples to the pixel efficiencies of embodiments of the disclosure.

DETAILED DESCRIPTION OF THE EMBODIMENTS

Figure 1:
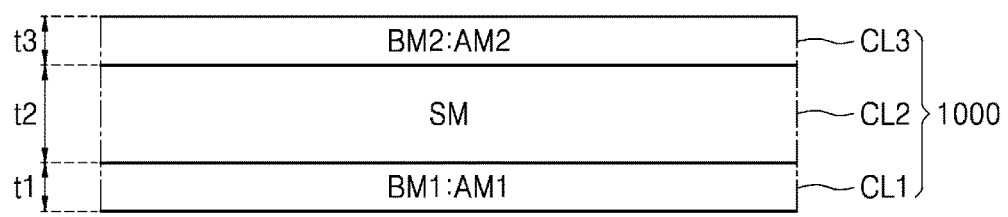
FIG. 1 is a schematic cross-sectional view of a multilayer electrode structure according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the" are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of,"

modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

The x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two processes described in succession may be performed substantially simultaneously, or may be performed in an order opposite to that described.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view of a multilayer electrode structure according to an embodiment.

Referring to FIG. 1, a multilayer electrode 1000 may include a first conductive layer CL1, a second conductive layer CL2, and a third conductive layer CL3 sequentially stacked. The second conductive layer CL2 may be disposed between the first conductive layer CL1 and the third conductive layer CL3.

The first conductive layer CL1 is a layer including different types of metal materials, and may include a first base metal BM1 and a first additive metal AM1 that is different from the first base metal BM1. That the first conductive layer CL1 includes the first base metal BM1 and the first additive metal AM1 may denote that the first conductive layer CL1 may include a material in which the first base metal BM1 and the first additive metal AM1 are alloyed, or may denote that both elements of the first base metal BM1 and the elements of the first additive metal AM1 are in the first conductive layer CL1.

In an embodiment, the first base metal BM1 may include materials selected from at least one of Ag, Au, Cu, Al, and Mg. In another embodiment, the first base metal BM1 may include at least one of metals having an electrical conductivity equal to or greater than about $1 \times 10^7$ S/m. In an embodiment, the first additive metal AM1 may include materials selected from at least one of Mg, Ca, Li, Au, Al, Yb, Cu, and Sm. In another embodiment, the first additive metal AM1 may include at least one of metals having a work function equal to or less than about 3 eV. Because the first conductive layer CL1 has to include different types of metal materials, the first base metal BM1 and the first additive metal AM1 have to be selected from different metal materials.

In an embodiment, a volume ratio of the first base metal BM1 to the first additive metal AM1 in the first conductive layer CL1 may be in a range of about 99:1 to about 1:1. For example, a volume amount of the first base metal BM1 may be equal to or greater than a volume amount of the first additive metal AM1.

The first conductive layer CL1 allows metal particles forming the second conductive layer CL2 to be evenly distributed in a process of initial formation of the second conductive layer CL2, to be described below, and thus, the second conductive layer CL2 may be uniformly formed.

The second conductive layer CL2 is a high conductive layer and may include a single metal material SM. That the second conductive layer CL2 includes the single metal material SM may denote that the second conductive layer CL2 includes pure single metal elements except for unavoidable impurities.

In an embodiment, the single metal material SM may include materials selected from at least one of Ag, Au, Cu, Al, and Mg. In another embodiment, the single metal material SM may include at least one of metals having an electrical conductivity equal to or greater than about $1\times10^7$ S/m. For example, the second conductive layer CL2 may include silver (Ag), and the second conductive layer CL2 may be provided as a pure silver (Ag) layer.

Because the second conductive layer CL2 includes a single metal material SM having a high electrical conductivity equal to or greater than about $1\times10^7$ S/m, the second conductive layer CL2 may be implemented as a high conductive layer. The multilayer electrode 1000 including the second conductive layer CL2 may have low resistance and high conductivity, and may realize high reflection while lowering light absorption rate and thus may improve outcoupling.

The third conductive layer CL3 is a layer including different types of metal materials, and may include a second base metal BM2 and a second additive metal AM2 that is different from the second base metal BM2. That the third conductive layer CL3 includes the second base metal BM2 and the second additive metal AM2 may denote that the third conductive layer CL3 may be include a material in which the second base metal BM2 and the second additive metal AM2 are alloyed, or may denote that both elements of the second base metal BM2 and elements of the second additive metal AM2 are in the third conductive layer CL3.

In an embodiment, the second base metal BM2 may include materials selected from at least one of Ag, Au, Cu, Al, and Mg. In another embodiment, the second base metal BM2 may include at least one of metals having an electrical conductivity equal to or greater than about $1\times10^7$ S/m. In an embodiment, the second additive metal AM2 may include materials selected from at least one of Mg, Ca, Li, Au, Al, Yb, Cu, and Sm. In another embodiment, the second additive metal AM2 may include at least one of metals having a work function equal to or less than about 3 eV or less. Because the third conductive layer CL3 has to include different types of metal materials, the second base metal BM2 and the second additive metal AM2 have to be selected from different metal materials.

In an embodiment, a volume ratio of the second base metal BM2 to the second additive metal AM2 in the third conductive layer CL3 may be in a range of about 99:1 to about 1:1. For example, a volume amount of the second base metal BM2 may be equal to or greater than a volume amount of the second additive metal AM2.

The third conductive layer CL3 may ensure thermal and electrical stability of the multilayer electrode 1000 through chemical bonding with atoms (e.g., Ag atoms) of the single metal material SM of the second conductive layer CL2 arranged directly under the third conductive layer CL3.

A thickness t1 of the first conductive layer CL1 and a thickness t3 of the third conductive layer CL3 may each be less than a thickness t2 of the second conductive layer CL2. A thickness t1 of the first conductive layer CL1 may be equal to or different from a thickness t3 of the third conductive layer CL3.

In an embodiment, a thickness t1 of the first conductive layer CL1 may be in a range of about 5 Å to about 30 Å. In an embodiment, a thickness t3 of the third conductive layer CL3 may be in a range of about 5 Å to about 30 Å. In an embodiment, a thickness t2 of the second conductive layer CL2 may be in a range of about 40 Å to about 120 Å.

In an embodiment, a thickness ratio (t1:t2:t3) of the first conductive layer CL1 to the second conductive layer CL2 to the third conductive layer CL3 may be about 1:6:1. For example, in order to satisfy the above-described thickness ratio (t1:t2:t3) of the first conductive layer CL1 to the second conductive layer CL2 to the third conductive layer CL3, the thickness t1 of the first conductive layer CL1 may be about 10 Å, the thickness t2 of the second conductive layer CL2 may be about 60 Å, and the thickness t3 of the third conductive layer CL3 may be about 10 Å.

The multilayer electrode 1000 may implement low resistance, high conductivity, and high transmittance through the second conductive layer CL2 including the single metal material SM having high conductivity, and may secure thermal and electrical stability of the second conductive layer CL2 through the first conductive layer CL1 and the third conductive layer CL3 respectively including the first additive metal AM1 and the second additive metal AM2 as dopants.

The multilayer electrode 1000 may be used as an electrode (e.g., an anode or a cathode) of an organic or inorganic photoelectronic element of a light-emitting device included in a display apparatus. For example, the light-emitting device may include an organic light-emitting diode, an inorganic light-emitting diode, a light-emitting diode, a quantum dot (QD)-light-emitting diode, an organic solar cell, a Perovskite-light-emitting diode, or a Perovskite solar cell.

Hereinafter, an example in which the multilayer electrode 1000 is included in a second electrode (e.g., a second electrode 230 in FIG. 5 or a cathode) of an organic light-emitting diode in a display apparatus will be described in detail.

Figure 2A:
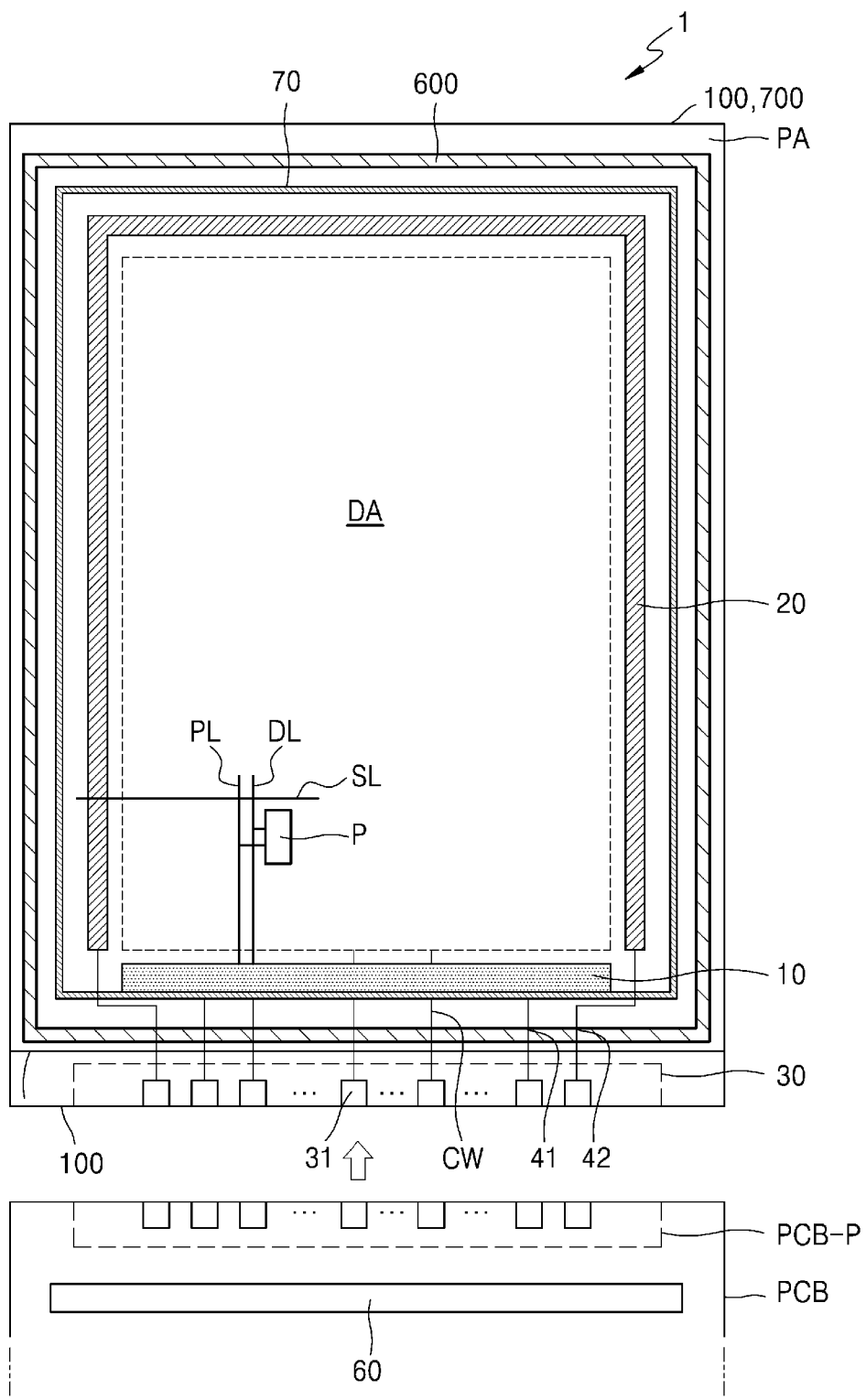
FIGS. 2A and 2B are schematic plan views illustrating examples of a display apparatus according to embodiments.
Figure 2B:
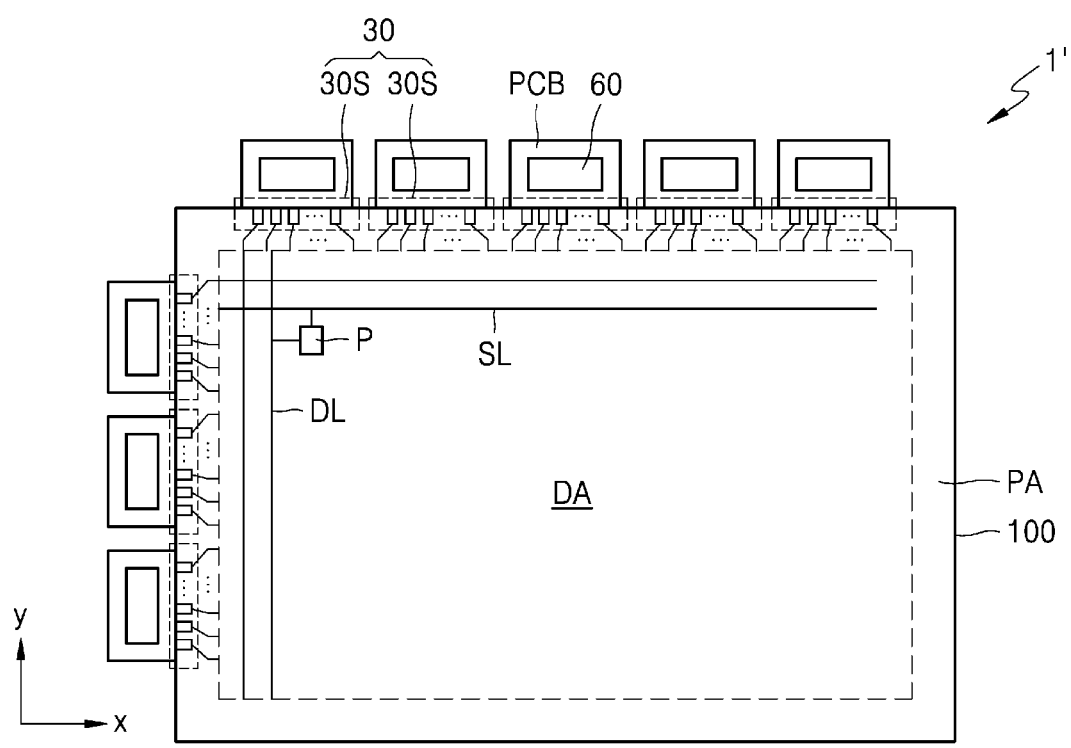

FIGS. 2A and 2B are schematic plan views illustrating examples of a display apparatus according to embodiments.

FIGS. 2A and 2B illustrate display apparatuses 1 and 1' having a display area DA having a substantially rectangular shape. In FIGS. 2A and 2B, various components may be arranged on a substrate 100 having a long axis and a short axis. From a user's perspective, FIG. 2A illustrates the display apparatus 1 in which a horizontal direction (e.g., an x-direction) is a short axis and a vertical direction (e.g., a y-direction) is a long axis, and FIG. 2B illustrates the display apparatus 1' in which a horizontal direction (e.g., an x-direction) is a long axis and a vertical direction (e.g., a y-direction) is a short axis. In the display apparatuses 1 and 1' according to embodiments, a printed circuit board PCB may be arranged in a short-axis direction of the display apparatus 1, as shown in FIG. 2A, and a printed circuit board PCB may be arranged in short-axis and long-axis directions of the display apparatus 1', as shown in FIG. 2B. In an embodiment, the display apparatus 1 as illustrated in FIG. 2A may be used in small and medium-sized electronic devices such as mobile phones, smartphones, tablet personal computers (PCs), mobile communication terminals, electronic notebooks, electronic books, portable multimedia players (PMPs), etc., and the display apparatus 1' as in FIG. 2B may be used in large electronic devices such as televisions, laptop computers, monitors, advertising boards, etc.

Referring to FIG. 2A, the display apparatus 1 may be formed by bonding the substrate 100 and an upper substrate 700 to each other with a sealing member 600. The sealing member 600 may be formed to surround outer surfaces of the substrate 100 and the upper substrate 700 to bond the substrate 100 and the upper substrate 700 to each other. The upper substrate 700 may be provided with a size slightly smaller than that of the substrate 100 so that a pad portion 30 may be exposed.

The display apparatus 1 may include the display area DA and a peripheral area PA arranged around the display area DA. The display apparatus 1 may provide a certain image by using light emitted from pixels P arranged in the display area DA. Hereinafter, the term "pixel P" used herein may indicate a sub-pixel including one organic light-emitting diode.

The display area DA includes pixels P connected to a data line DL extending in the y-direction and a scan line SL extending in the x-direction crossing the y-direction. Each pixel P is also connected to a driving voltage line PL extending in the y-direction.

Each pixel P may include a display element such as an organic light-emitting diode. Each pixel P may emit red, green, blue, or white light, for example, through the organic light-emitting diode. In embodiments, a color of each pixel P may be implemented by a color filter or the like arranged above the organic light-emitting diode, separate from colors of light emitted from the organic light-emitting diodes included in the pixels P.

Each pixel P may be electrically connected to built-in circuits arranged in the peripheral area PA. A first power supply wire 10, a second power supply wire 20, and the pad portion 30 may be arranged in the peripheral area PA.

The first power supply wire 10 may be arranged to correspond to one side of the display area DA. The first power supply wire 10 may be connected to driving voltage lines PL that transmit a driving voltage ELVDD (see FIGS. 3A and 3B to be described below) to the pixel P.

The second power supply wire 20 having a loop shape with one open side may partially surround the display area DA. The second power supply wire 20 may supply a common voltage to a second electrode of the pixel P. The second power supply wire 20 may be referred to as a common voltage supply wire.

The pad portion 30 may include pads 31 and may be arranged on a side of the substrate 100. Each pad 31 may be connected to a first connection wire 41 connected to the first power supply wire 10, connection wires CW extending to the display area DA, etc. The pads 31 of the pad portion 30 may be exposed and electrically connected to the printed circuit board PCB by not being covered with an insulating layer. A terminal portion PCB-P of the printed circuit board PCB may be electrically connected to the pad portion 30.

The printed circuit board PCB may transmit a signal or power of a controller (not shown) to the pad portion 30. The controller may supply a driving voltage ELVDD and a common voltage ELVSS (see FIGS. 3A and 3B to be described below) to the first and second power supply wires 10 and 20 through first and second connection wires 41 and 42.

A data driving circuit 60 may be electrically connected to the data line DL. A data signal of the data driving circuit 60 may be applied to each pixel P through a connection wire CW connected to the pad portion 30 and the data line DL connected to the connection wire CW. Although FIG. 2A illustrates that the data driving circuit 60 is arranged on the printed circuit board PCB, in another embodiment, the data driving circuit 60 may be arranged on the substrate 100. For example, the data driving circuit 60 may be arranged between the pad portion 30 and the first power supply wire 10.

A dam portion 70 may be arranged in the peripheral area PA. When an organic encapsulation layer 320 of a thin-film encapsulation layer 300 (see FIG. 8) is formed, the dam portion 70 may prevent an organic material from flowing in an edge direction of the substrate 100, thereby preventing formation of an edge tail of the organic encapsulation layer 320. The dam portion 70 may be arranged on the peripheral area PA to surround at least a portion of the display area DA. The dam portion 70 may include dams, and when the dams are arranged, the dams may be formed to be spaced apart from each other. The dam portion 70 may be arranged closer to the display area DA than the sealing member 600 in the peripheral area PA. A built-in driving circuit portion (not shown) for applying a scan signal of each pixel may be further included in the peripheral area PA. In embodiments, the built-in driving circuit portion and the dam portion 70 may be formed to overlap each other.

The display apparatus 1' in FIG. 2B is similar to that of FIG. 2A described above. However, although FIG. 2A illustrates that one printed circuit board PCB is attached to the pad portion 30, multiple printed circuit boards PCB may be attached to the pad portion 30 as shown in FIG. 2B. In FIG. 2B, the pad portion 30 may be arranged along two sides of the substrate 100. The pad portion 30 may be provided as multiple sub-pad portions 30S, and one printed circuit board PCB may be attached to each sub-pad portion 30S.

Figure 3A:
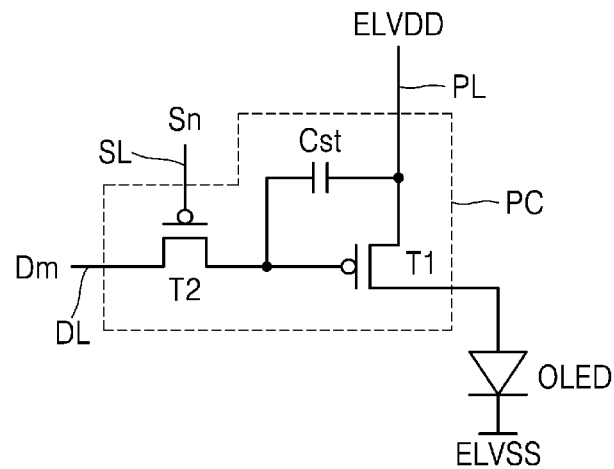
FIGS. 3A and 3B are equivalent circuit diagrams of a pixel of a display apparatus according to an embodiment.
Figure 3B:
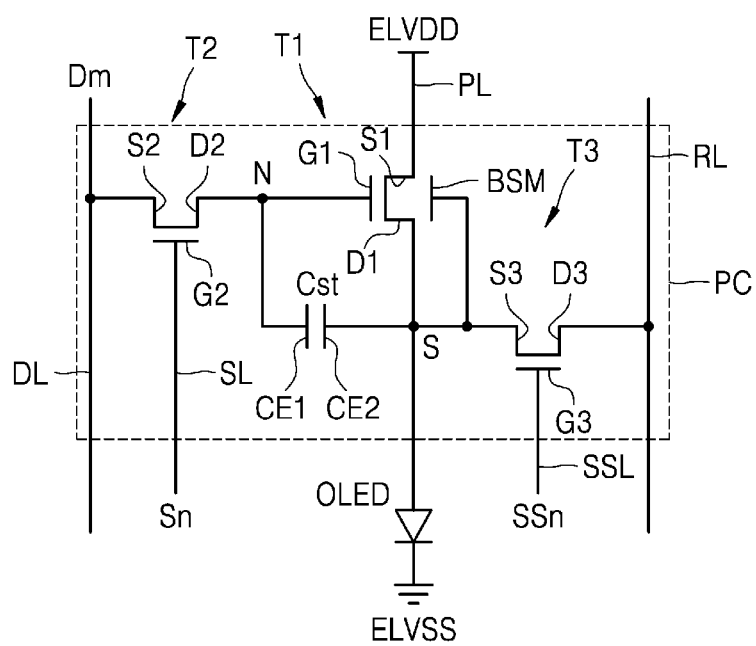

FIGS. 3A and 3B are equivalent circuit diagrams of a pixel of a display apparatus according to an embodiment.

Referring to FIG. 3A, each pixel P may be implemented by a pixel circuit PC connected to the scan line SL and to the data line DL, and an organic light-emitting diode OLED connected to the pixel circuit PC. The pixel circuit PC may include a driving thin-film transistor T1, a switching thin-film transistor T2, and a storage capacitor Cst. The switching thin-film transistor T2 may be connected to the scan line SL and to the data line DL and may be configured to transmit, to the driving thin-film transistor T1, a data signal Dm input through the data line DL, in response to a scan signal Sn input through the scan line SL.

The storage capacitor Cst may be connected to the switching thin-film transistor T2 and to the driving voltage line PL and may be configured to store a voltage corresponding to a difference between a voltage received from the switching thin-film transistor T2 and a first power supply voltage ELVDD (or driving voltage) supplied to the driving voltage line PL.

The driving thin-film transistor T1 may be connected to the driving voltage line PL and to the storage capacitor Cst and may be configured to control a driving current flowing from the driving voltage line PL to the organic light-emitting diode OLED in response to a voltage value stored in the storage capacitor Cst. The organic light-emitting diode OLED may emit light having a certain luminance according to the driving current.

FIG. 3A illustrates that the pixel circuit PC includes two thin-film transistors and one storage capacitor, but embodiments are not limited thereto.

Referring to FIG. 3B, the pixel circuit PC may include the driving thin-film transistor T1, the switching thin-film transistor T2, and a sensing thin-film transistor T3, and the storage capacitor Cst.

The scan line SL may be connected to a gate electrode G2 of the switching thin-film transistor T2, the data line DL may be connected to a source electrode S2 of the switching thin-film transistor T2, and a first electrode CE1 of the storage capacitor Cst may be connected to a drain electrode D2 of the switching thin-film transistor T2.

Accordingly, the switching thin-film transistor T2 may be configured to supply a data voltage of the data line DL to a first node N in response to the scan signal Sn input from the scan line SL of each pixel P.

A gate electrode G1 of the driving thin-film transistor T1 may be connected to the first node N, a source electrode S1 of the driving thin-film transistor T1 may be connected to the driving voltage line PL transmitting the driving voltage ELVDD, and a drain electrode D1 of the driving thin-film transistor T1 may be connected to an anode electrode of the organic light-emitting diode OLED.

Accordingly, the driving thin-film transistor T1 may be configured to adjust the amount of current flowing through the organic light-emitting diode OLED according to its source-gate voltage (Vgs), for example, a voltage applied between the driving voltage ELVDD and the first node N.

A sensing control line SSL may be connected to a gate electrode G3 of the sensing thin-film transistor T3, a source electrode S3 of the sensing thin-film transistor T3 may be connected to a second node S, and a drain electrode D3 of the sensing thin-film transistor T3 may be connected to a reference voltage line RL. In an embodiment, the sensing thin-film transistor T3 may be controlled by the scan line SL, instead of the sensing control line SSL.

The sensing thin-film transistor T3 may sense a potential of a first electrode (e.g., the anode) of the organic light-emitting diode OLED. The sensing thin-film transistor T3 may be configured to supply a pre-charging voltage Vpre from the reference voltage line RL to the second node S in response to a sensing signal SSn from the sensing control line SSL, or supply a voltage of the first electrode (e.g., the anode) of the organic light-emitting diode OLED to the reference voltage line RL during a sensing period.

In the storage capacitor Cst, the first electrode CE1 may be connected to the first node N and a second electrode CE2 may be connected to the second node S. The storage capacitor Cst may be configured to charge a voltage corresponding to a difference between voltages supplied to the first and second nodes N and S, so as to supply the same as a driving voltage of the driving thin-film transistor T1. For example, the storage capacitor Cst may be configured to charge a voltage corresponding to a difference between a data voltage Dm and the pre-charging voltage Vpre respectively supplied to the first and second nodes N and S.

A bias electrode BSM may be formed to correspond to the driving thin-film transistor T1 to be connected to the source electrode S3 of the sensing thin-film transistor T3. Because the bias electrode BSM is supplied with a voltage in connection with a potential of the source electrode S3 of the sensing thin-film transistor T3, the driving thin-film transistor T1 may be stabilized. In an embodiment, the bias electrode BSM may not be connected to the source electrode S3 of the sensing thin-film transistor T3, but may be connected to a separate bias wire.

The second electrode (e.g., the cathode) of the organic light-emitting diode OLED may receive the common voltage ELVSS. The organic light-emitting diode OLED may receive a driving current from the driving thin-film transistor T1 to emit light.

FIG. 3B illustrates that each pixel P includes signal lines SL, SSL, and DL, a reference voltage line RL, and a driving voltage line PL, but embodiments are not limited thereto. For example, at least one of the signal lines SL, SSL, and DL, and/or the reference voltage line RL, and the driving voltage line PL may be shared by neighboring pixels.

The pixel circuit PC is not limited to the number and circuit design of the thin-film transistors and the storage capacitor described with reference to FIGS. 3A and 3B, and the number and the circuit design thereof may be variously changed.

Figure 4:
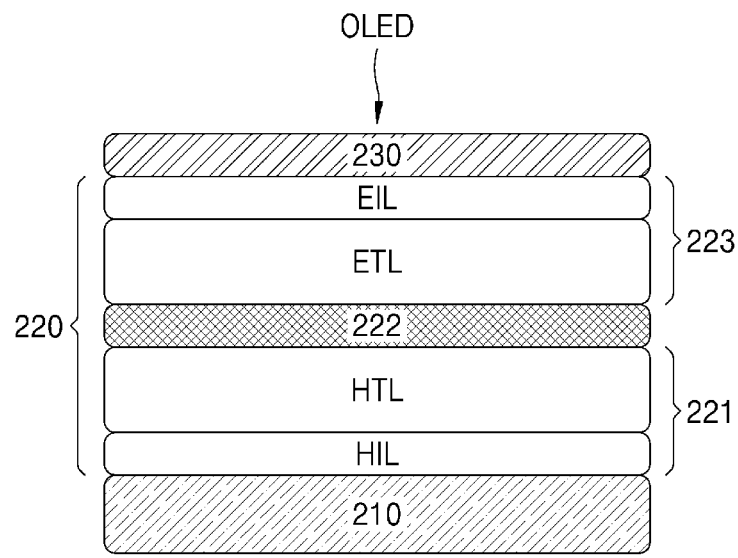
FIGS. 4 and 5 are schematic cross-sectional views of a stacked structure of an organic light-emitting diode that may be used in a display apparatus according to an embodiment.
Figure 5:
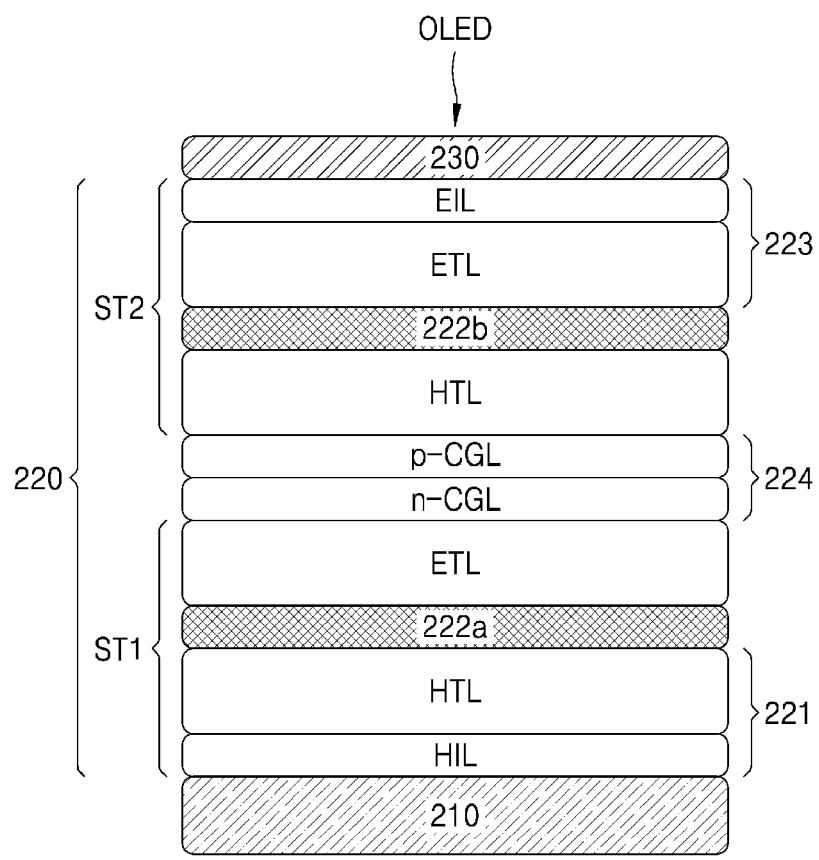

FIGS. 4 and 5 are schematic cross-sectional views of a stacked structure of an organic light-emitting diode OLED that may be used in a display apparatus according to an embodiment.

Referring to FIG. 4, the organic light-emitting diode OLED, which is a light-emitting element, may be included in each pixel P (see FIG. 2A or 2B). The organic light-emitting diode OLED may be electrically connected to the pixel circuit PC in FIG. 3A or 3B, and may receive power or a signal through the pixel circuit PC to control the degree of light emission.

The organic light-emitting diode OLED may include a first electrode 210, a second electrode 230, and an interlayer 220 between the first electrode 210 and the second electrode 230. The first electrode 210 may be patterned and provided for each organic light-emitting diode OLED, and the second electrode 230 may be provided in an integrated form for multiple organic light-emitting diodes OLED.

A first common layer 221 may be arranged on the first electrode 210. The first common layer 221 may function as a hole transport region. The first common layer 221 may include at least one layer selected from among a hole injection layer HIL, a hole transport layer HTL, an emission auxiliary layer, and an electron blocking layer. Thicknesses of the hole injection layer HIL, the hole transport layer HTL, the emission auxiliary layer, and the electron blocking layer may be independent of each other.

For example, the hole transport region may have a single-layer structure including a layer including different materials, or a multilayer structure of a hole injection layer/hole transport layer, a hole injection layer/hole transport layer/ emission auxiliary layer, a hole injection layer/emission auxiliary layer, a hole transport layer/emission auxiliary layer, or a hole injection layer/hole transport layer/electron blocking layer stacked from the first electrode in its respective stated order, but is not limited thereto.

In an embodiment, it is illustrated that the organic light-emitting diode OLED in FIG. 4 includes the hole injection layer HIL and the hole transport layer HTL as a hole transport region. The hole injection layer HIL may be arranged adjacent to the first electrode 210, and the hole transport layer HTL may be arranged on the hole injection layer HIL.

The hole injection layer HIL may facilitate injection of holes and may include one or more selected from the group consisting of hexaazatriphenylenehexacarbonitrile (HATCN) and copper phthalocyanine (CuPC), poly(3,4)-ethylenedioxythiophene (PEDOT), polyaniline (PANI), and N, N-dinaphthyl-N, N'-diphenylbenzidine (NPD), but is not limited thereto.

The hole transport layer HTL may include a triphenylamine derivative having high hole mobility and excellent stability as a host of a hole transport layer, such as tris(4-carbazoyl-9-ylphenyl)amine (TCTA), N, N'-diphenyl-N,N'-bis(3-methylphenyl)-1,1'-bi-phenyl-4,4'-diamine) (TPD), or naphthalen-1-yl)-N, N'-diphenyl-benzidine (NPB). Although FIG. 4 illustrates that the hole transport layer HTL includes a single layer, the hole transport layer HTL may have a multilayer structure. The hole transport layer HTL may have a multilayer structure of two or more layers including different materials selected from the above-described materials. For example, the hole transport layer HTL may be provided as two layers respectively including NPB and TCTA.

An emission layer 222 may be arranged on the first common layer 221. The emission layer 222 may include an organic material emitting one of red, blue, or green light. For example, when the emission layer 222 emits red light, the emission layer 222 may be formed by using, for example, a red dopant in a certain host material. As another example, when the emission layer 222 emits green light, the emission layer 222 may be formed by using, for example, a green dopant in a certain host material. As yet another example, when the emission layer 222 emits blue light, the emission layer 222 may be formed by using, for example, a blue dopant in a certain host material.

A second common layer 223 may be arranged on the emission layer 222. The second common layer 223 may function as an electron transport region. The second common layer 223 may include at least one layer selected from among a buffer layer, a hole blocking layer, an electron control layer, an electron transport layer ETL, and an electron injection layer EIL. Thicknesses of the buffer layer, the hole blocking layer, the electron control layer, the electron transport layer ETL, and the electron injection layer EIL may be independent of each other.

For example, the electron transport region may have a single-layer structure including a layer including different materials, or a multilayer structure of an electron transport layer/electron injection layer, a hole blocking layer/electron transport layer/electron injection layer, an electron control layer/electron transport layer/electron injection layer, or a buffer layer/electron transport layer/electron injection layer stacked from an emission layer in its respective stated order, but is not limited thereto.

In an embodiment, it is illustrated that the organic light-emitting diode OLED in FIG. 4 includes the electron injection layer EIL and the electron transport layer ETL as an electron transport region. The electron injection layer EIL may be arranged adjacent to the second electrode 230, and the electron transport layer ETL may be arranged on the emission layer 222.

The electron transport layer ETL may facilitate transport of electrons and may include one or more selected from the group consisting of tris(8-hydroxyquinolinato)aluminum (Alq3), PBD, TAZ, spiro-PBD, BAlq, lithium quinolate (Liq), BMB-3T, PF-6P, TPBI, COT, and Salq, but is not limited thereto.

The electron injection layer EIL may facilitate injection of electrons and may include Yb, tris(8-hydroxyquinolinato) aluminum (Alq3), PBD, TAZ, spiro-PBD, Balq, or Salq, but is not limited thereto.

FIG. 4 illustrates that the organic light-emitting diode OLED includes all of the hole injection layer HIL, the hole transport layer HTL, the electron transport layer ETL, and the electron injection layer EIL, but embodiments are not limited thereto. In another embodiment, at least one of the hole injection layer HIL, the hole transport layer HTL, the electron transport layer ETL, and the electron injection layer EIL may be omitted.

Other layers aside from the emission layer 222, for example, the hole injection layer HIL, the hole transport layer HTL, the electron transport layer ETL, and the electron injection layer EIL, may be provided as one body over multiple organic light-emitting diodes OLED.

The organic light-emitting diode OLED may have a tandem structure including stacks of m or more emitting units, wherein m is an integer greater than or equal to 2. Charge generation layers 224 in the number of m−1 may be between the stacks of emitting units.

Referring to FIG. 5, in an embodiment, the organic light-emitting diode OLED may have a tandem structure including stacks of two or more emitting units. FIG. 5 illustrates the organic light-emitting diode OLED having a first stack ST1 and a second stack ST2, formed as two emitting units. A first emission layer 222a and a second emission layer 222b may be arranged in the first stack ST1 and the second stack ST2, respectively. A charge generation layer 224 may be between the first stack ST1 and the second stack ST2.

Hereinafter, layers stacked on the first electrode 210 will be described in detail.

A first common layer 221 may be arranged on the first electrode 210. The first common layer 221 is the same as that described above with reference to FIG. 4, and thus, detailed descriptions thereof are omitted.

The first emission layer 222a may be arranged on the first common layer 221. The first emission layer 222a may include an organic material emitting one of red, blue, or green light. For example, when the first emission layer 222a emits red light, the first emission layer 222a may be formed by using, for example, a red dopant in a certain host material. As another example, when the first emission layer 222a emits green light, the first emission layer 222a may be formed by using, for example, a green dopant in a certain host material. As yet another example, when the first emission layer 222a emits blue light, the first emission layer 222a may be formed by using, for example, a blue dopant in a certain host material.

An electron transport layer ETL may be arranged on the first emission layer 222a. The electron transport layer ETL arranged on the first emission layer 222a may perform the same function as an electron transport layer ETL included in a second common layer 223.

The charge generation layer 224 may be arranged on the electron transport layer ETL. The charge generation layer 224 may be between the first stack ST1 and the second stack ST2. In FIG. 5, the charge generation layer 224 may be between the electron transport layer ETL of the first stack ST1 and the hole transport layer HTL of the second stack ST2.

In an embodiment, the charge generation layer 224 may include an n-type charge generation layer n-CGL for supplying electrons to the first stack ST1, and a p-type charge generation layer p-CGL for supplying holes to the second stack ST2.

The n-type charge generation layer n-CGL may include an n-type dopant material and an n-type host material. In an embodiment, a volume ratio of the n-type host material to the n-type dopant material may be in a range of about 99:1 to about 90:10. The n-type dopant material may include a metal dopant, and the n-type host material may include an organic material, such as an organic semiconductor material.

The n-type dopant material may be an organic material capable of injecting metals or electrons of Group 1 elements and Group 2 elements in the periodic table, or a mixture thereof. For example, the n-type dopant material may include any one of an alkali metal and an alkaline earth metal. For example, the n-type charge generation layer n-CGL may include an organic layer doped with an alkali metal such as lithium (Li), sodium (Na), potassium (K), or cesium (Cs), or an alkaline earth metal such as magnesium (Mg), strontium (Sr), barium (Ba), radium (Ra), or ytterbium (Yb), but is not limited thereto. As another example, the n-type dopant material may include a lanthanide. For example, the n-type dopant material may include any one of dysprosium (Dy), europium (Eu), and samarium (Sm). As the n-type dopant material, a metal having a work function of less than about −3 eV may be used.

The n-type host material may include a material capable of transmitting electrons, for example, at least one of tris (8-hydroxyquinolinato)aluminum (Alq3), 8-hydroxyquinolinolato-lithium (Liq), 2-(4-biphenylyl)-5-(4-tert-butylphenyl)-1,3,4 oxadiazole (PBD), 3-(4-biphenyl)4-phenyl-5-tert-butylphenyl-1,2,4-triazole (TAZ), spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole (TPBi), oxadiazole, triazole, phenanthroline, benzoxazole, and benzothiazole, but is not limited thereto.

The p-type charge generation layer p-CGL may include a p-type dopant material and a p-type host material. In an embodiment, a volume ratio of the p-type host material and the p-type dopant material may be in a range of about 99:1 to about 80:20. The p-type host material and the p-type dopant material may include organic materials. For example, the p-type host material may include a first organic semiconductor material, and the p-type dopant material may include a second organic semiconductor material or a metal material.

The p-type dopant material may include an organic material such as a metal oxide, tetrafluoro-tetracyanoquinodimethane (F4-TCNQ), hexaazatriphenylenehexacarbonitrile (HAT-CN), hexaazatriphenylene, etc. or a metal material such as $V_2O_5$, MoOx, $WO_3$, etc. The p-type host material may include a material capable of transmitting holes, for example, a material including at least one of N,N-dinaphthyl-N, N'-diphenylbenzidine (NPD), N, N'-bis(naphthalene-1-yl)-N, N'-bis(phenyl)-2,2'-dimethylbenzidine, N,N'-bis-(3-methylphenyl)-N,N'-bis-(phenyl)-benzidine (TPD), and 4,4',4-tris(N-3-methylphenyl-N-phenyl-amino)-triphenylamine (MTDATA), but is not limited thereto.

Each of the n-type charge generation layer n-CGL and the p-type charge generation layer p-CGL may be formed to have a thickness in a range of about 1 Å to about 200 Å. When the thicknesses of the n-type charge generation layer n-CGL and the p-type charge generation layer p-CGL satisfy the above-described range, satisfactory charge transport characteristics may be obtained without a substantial increase in driving voltage.

The second stack ST2 may be arranged on the charge generation layer 224. For example, a hole transport layer HTL may be arranged on the p-type charge generation layer p-CGL. The hole transport layer HTL of the second stack ST2 may be the same as the hole transport layer HTL in the first stack ST1.

A second emission layer 222b may be arranged on the hole transport layer HTL. The second emission layer 222b may include an organic material emitting one of red, blue, or green light. For example, when the second emission layer 222b emits red light, the second emission layer 222b may be formed by using, for example, a red dopant in a certain host material. As another example, when the second emission layer 222b emits green light, the second emission layer 222b may be formed by using, for example, a green dopant in a certain host material. As yet another example, when the second emission layer 222b emits blue light, the second emission layer 222b may be formed by using, for example, a blue dopant in a certain host material.

In an embodiment, the first emission layer 222a and the second emission layer 222b may emit light having a same wavelength or may emit light having different wavelengths. For example, both the first emission layer 222a and the second emission layer 222b may emit blue light. As another example, the first emission layer 222a may emit blue light and the second emission layer 222b may emit green light. However, embodiments are not limited thereto.

The second common layer 223 may be arranged on the second emission layer 222b. The second common layer 223 may function as an electron transport region. The second common layer 223 is the same as that described above with reference to FIG. 4, and thus, detailed descriptions thereof are omitted.

The organic light-emitting diode OLED described with reference to FIGS. 4 and 5 may include a second electrode 230 on the second common layer 223. The second electrode 230 may be provided as one body over multiple organic light-emitting diodes OLED like the first common layer 221 and the second common layer 223.

The second electrode 230 may include a conductive material having a low work function. For example, the second electrode 230 may include a (semi-) transparent layer including silver (Ag), Mg, Al, platinum (Pt), palladium (Pd), gold (Au), nickel (Ni), neodymium (Nd), iridium (Ir), chromium (Cr), Li, calcium (Ca), or an alloy thereof. As another example, the second electrode 230 may further include a layer including ITO, IZO, ZnO, or $In_2O_3$ on the (semi-) transparent layer including the above-described material.

The second electrode 230 requires a low sheet resistance to increase power efficiency and to reduce IR drop (i.e., voltage drop). However, a trade-off relationship, in which the light absorption rate of the second electrode 230 increases and the light efficiency of the organic light-emitting diode OLED is lowered, is established. Therefore, it is necessary to implement the second electrode 230 having both a low sheet resistance and a low light absorption rate.

In an embodiment, the second electrode 230 may have a multilayer structure. The second electrode 230 may include a first conductive layer (i.e., a first conductive layer 231 in FIG. 6), and a second conductive layer (i.e., a second conductive layer 232 in FIG. 6) including a single metal material. This will be described in detail with reference to FIGS. 6 to 7.

Figure 6:
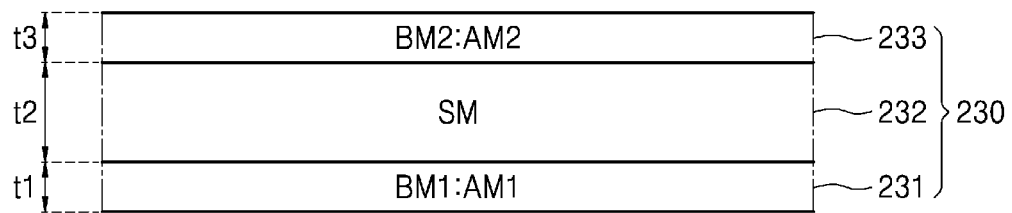
FIGS. 6 to 7 are schematic cross-sectional views of a stacked structure of a second electrode according to an embodiment.
Figure 7:
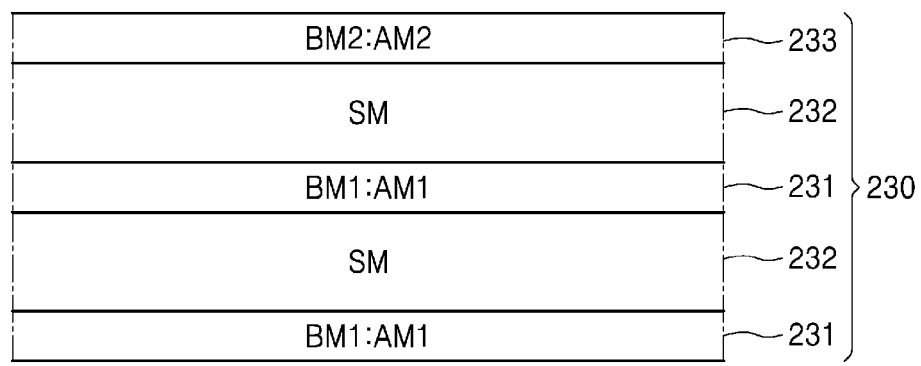

FIGS. 6 to 7 are schematic cross-sectional views of a stacked structure of the second electrode 230 according to an embodiment.

Referring to FIG. 6, the second electrode 230 may include a first conductive layer 231, a second conductive layer 232, and a third conductive layer 233 sequentially stacked. The first conductive layer 231 may be arranged on the electron injection layer EIL in FIG. 4 or 5. The second conductive layer 232 may be disposed between the first conductive layer 231 and the third conductive layer 233.

The first conductive layer 231 is a layer including different types of metal materials, and may include a first base metal BM1 and a first additive metal AM1 that is different from the first base metal BM1. That the first conductive layer 231 includes the first base metal BM1 and the first additive metal AM1 may denote that the first conductive layer 231 may include a material in which the first base metal BM1 and the first additive metal AM1 are alloyed, or may denote that both elements of the first base metal BM1 and elements of the first additive metal AM1 are in the first conductive layer 231. For example, in order to allow the first conductive layer 231 to include the first base metal BM1 and the first additive metal AM1, the first conductive layer 231 may be formed by simultaneously spraying the material of the first base metal BM1 and the material of the first additive metal AM1 on a substrate.

In an embodiment, the first base metal BM1 may include materials selected from at least one of Ag, Au, Cu, Al, and Mg. In another embodiment, the first base metal BM1 may include at least one of metals having an electrical conductivity equal to or greater than about $1 \times 10^7$ S/m. In an embodiment, the first additive metal AM1 may include materials selected from at least one of Mg, Ca, Li, Au, Al, Yb, Cu, and Sm. In another embodiment, the first additive metal AM1 may include at least one of metals having a work function equal to or less than about 3 eV. Because the first conductive layer 231 has to include different types of metal materials, the first base metal BM1 and the first additive metal AM1 have to be selected from different metal materials.

In an embodiment, a volume ratio of the first base metal BM1 to the first additive metal AM1 in the first conductive layer 231 may be in a range of about 99:1 to about 1:1. For example, the first conductive layer 231 may include an amount of the first base metal BM1 in a range of about 50% to about 99% by volume, and an amount of the first additive metal AM1 in a range of about 1% to about 50% by volume. Thus, a volume amount of the first base metal BM1 may be equal to or greater than a volume amount of the first additive metal AM1. In an embodiment, the first conductive layer 231 may include Ag as the first base metal BM1 and Mg as the first additive metal AM1, such that the first conductive layer 231 may be a silver-rich layer having a high silver content.

The first conductive layer 231 allows metal particles forming the second conductive layer 232 to be evenly distributed in a process of initial formation of the second conductive layer 232, to be described below, and thus, the second conductive layer 232 may be uniformly formed.

The second conductive layer 232 is a high conductive layer and may include a single metal material SM. That the second conductive layer 232 includes the single metal material SM may denote that the second conductive layer 232 includes pure single metal elements except for unavoidable impurities.

In an embodiment, the single metal material SM may include materials selected from at least one of Ag, Au, Cu, Al, and Mg. In another embodiment, the single metal material SM may include at least one of metals having an electrical conductivity equal to or greater than about $1 \times 10^7$ S/m. For example, the second conductive layer 232 may include silver (Ag), and the second conductive layer CL2 may be provided as a pure silver (Ag) layer.

Because the second conductive layer 232 includes a single metal material SM having a high electrical conductivity equal to or greater than about $1 \times 10^7$ S/m, the second conductive layer 232 may be implemented as a high conductive layer. The second electrode 230 including the second conductive layer 232 may have low resistance and high conductivity, and may realize high reflection while lowering light absorption rate and thus may improve out-coupling.

The third conductive layer 233 is a layer including different types of metal materials, and may include a second base metal BM2 and a second additive metal AM2 that is different from the second base metal BM2. That the third conductive layer 233 includes the second base metal BM2 and the second additive metal AM2 may denote that the third conductive layer 233 may include a material in which the second base metal BM2 and the second additive metal AM2 are alloyed, or may denote that both elements of the second base metal BM2 and elements of the second additive metal AM2 are in the third conductive layer 233. For example, in order to allow the third conductive layer 233 to include the second base metal BM2 and the second additive metal AM2, the third conductive layer 233 may be formed by simultaneously spraying the material of the second base metal BM2 and the material of the second additive metal AM2 on a substrate.

In an embodiment, the second base metal BM2 may include materials selected from at least one of Ag, Au, Cu, Al, and Mg. In another embodiment, the second base metal BM2 may include at least one of metals having an electrical conductivity equal to or greater than about $1 \times 10^7$ S/m. In an embodiment, the second additive metal AM2 may include materials selected from at least one of Mg, Ca, Li, Au, Al, Yb, Cu, and Sm. In another embodiment, the second additive metal AM2 may include at least one of metals having a work function equal to or less than about 3 eV. Because the third conductive layer CL3 has to include different types of metal materials, the second base metal BM2 and the second additive metal AM2 have to be selected from different metal materials.

In an embodiment, a volume ratio of the second base metal BM2 to the second additive metal AM2 in the third conductive layer 233 may be in a range of about 99:1 to about 1:1. For example, the third conductive layer 233 may include an amount of the second base metal BM2 in a range of about 50% to about 99% by volume, and an amount of the second additive metal AM2 in a range of about 1% to about 50% by volume. Thus, a volume amount of the second base metal BM2 may be equal to or greater than a volume amount of the second additive metal AM2. In an embodiment, the third conductive layer 233 may include Ag as the second base metal BM2 and Mg as the second additive metal AM2, such that the third conductive layer 233 may be a silver-rich layer having a high silver content.

The third conductive layer 233 may ensure thermal and electrical stability of the second electrode 230 through chemical bonding with atoms (e.g., Ag atoms) of the single metal material SM of the second conductive layer 232 arranged directly under the third conductive layer 233.

In an embodiment, the third conductive layer 233 may be provided as a same layer as the first conductive layer 231. That the first conductive layer 231 and the third conductive layer 233 are a same layer may denote that the first base metal BM1 of the first conductive layer 231 and the second base metal BM2 of the third conductive layer 233 include a same material and the first additive metal AM1 of the first conductive layer 231 and the second additive metal AM2 of the third conductive layer 233 may include a same material. However, even in such an embodiment, a volume ratio of the first base metal BM1 to the first additive metal AM1 in the first conductive layer 231 may be equal to or different from a volume ratio of the second base metal BM2 to the second additive metal AM2 in the third conductive layer 233.

In another embodiment, the third conductive layer 233 may be provided as a different layer from the first conductive layer 231. That the first conductive layer 231 and the third conductive layer 233 are different layers may denote that the first base metal BM1 of the first conductive layer 231 and the second base metal BM2 of the third conductive layer 233 include different materials, or that the first additive metal AM1 of the first conductive layer 231 and the second additive metal AM2 of the third conductive layer 233 include different materials.

A thickness t1 of the first conductive layer 231 and a thickness t3 of the third conductive layer 233 may each be less than a thickness t2 of the second conductive layer 232. A thickness t1 of the first conductive layer 231 may be equal to or different from a thickness t3 of the third conductive layer 233.

In an embodiment, a thickness t1 of the first conductive layer 231 may be in a range of about 5 Å to about 30 Å. In an embodiment, a thickness t3 of the third conductive layer 233 may be in a range of about 5 Å to about 30 Å. When the thicknesses t1 and t3 of the first conductive layer 231 and the third conductive layer 233 are each less than 5 Å, it may be difficult to form the first conductive layer 231 and the third conductive layer 233 in a process therefor, and when the thicknesses t1 and t3 each exceed 30 Å, the light transmittance of the first and third conductive layers 231 and 233 may be lowered. In an embodiment, a thickness t2 of the second conductive layer 232 may be in a range of about 40 Å to about 120 Å. When the thickness t2 of the second conductive layer 232 is less than 40 Å, it may be difficult to realize sufficient electrical conductivity of the second conductive layer 232, and when the thickness t2 exceeds 120 Å, the light absorption rate of the second conductive layer 232 may increase and the efficiency of the organic light-emitting diode OLED may be lowered.

In an embodiment, a thickness ratio (t1:t2:t3) of the first conductive layer 231 to the second conductive layer 232 to the third conductive layer 233 may be about 1:6:1. For example, in order to satisfy the above-described thickness ratio (t1:t2:t3) of the first conductive layer 231 to the second conductive layer 232 to the third conductive layer 233, the thickness t1 of the first conductive layer 231 may be about 10 Å, the thickness t2 of the second conductive layer 232 may be about 60 Å, and the thickness t3 of the third conductive layer 233 may be about 10 Å.

Referring to FIG. 7, the second electrode 230 includes a first conductive layer 231, a second conductive layer 232, and a third conductive layer 233 sequentially stacked, but multiples of each of the first conductive layer 231 and the second conductive layer 232 may be provided. Each of the first conductive layer 231 and the second conductive layer 232 may be repeatedly provided in n numbers, and the third conductive layer 233 may be located at the top. FIG. 7 illustrates a structure in which a first conductive layer 231, a second conductive layer 232, a first conductive layer 231, a second conductive layer 232, and a third conductive layer 233 are sequentially stacked. The properties of each of the first conductive layer 231, the second conductive layer 232, and the third conductive layer 233 are the same as those described above with reference to FIG. 6.

In this way, through a structure in which n first conductive layers 231 and n second conductive layers 232, wherein n is an integer greater than or equal to 2, are alternately stacked and a third conductive layer 233 is stacked on the top, multiple second conductive layers 232 each including a single metal material SM may be provided, thereby implementing the second electrode 230 having high conductivity.

Figure 8:
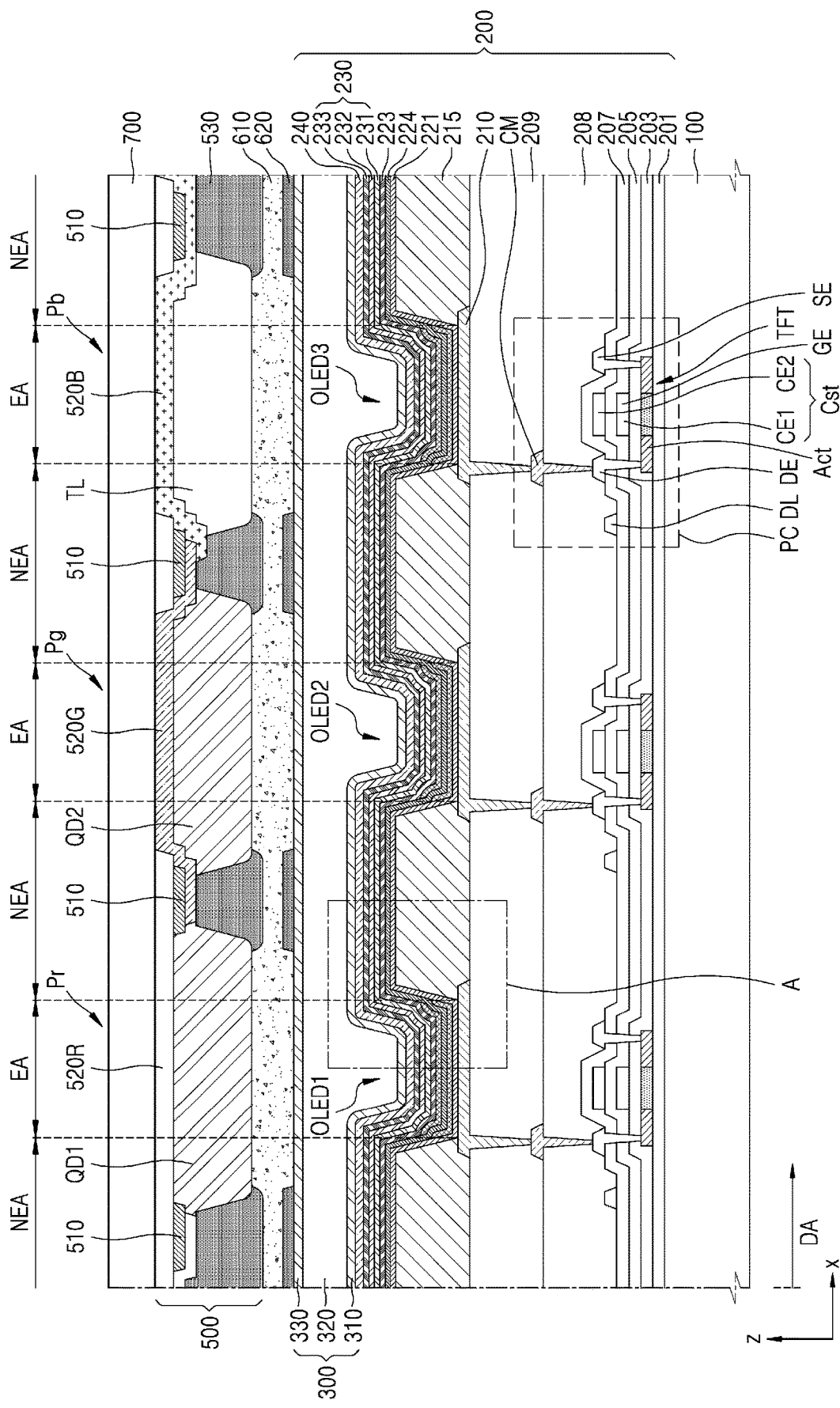
FIG. 8 is a schematic cross-sectional view of a portion of a display apparatus according to an embodiment.

FIG. 8 is a schematic cross-sectional view of a portion of a display apparatus according to an embodiment.

Referring to FIG. 8, first to third pixels Pr, Pg, and Pb may be arranged on a substrate 100. The first to third pixels Pr, Pg, and Pb include first to third organic light-emitting diodes OLED1, OLED2, and OLED3, respectively, and a pixel circuit PC, and each of the first to third organic light-emitting diodes OLED1, OLED2, and OLED3 is electrically connected to the pixel circuit PC, so that light emission may be controlled. In the following description, the pixel circuits PC included in the first to third pixels Pr, Pg, and Pb have the same structure, and thus, a stacked structure will be described regarding a pixel.

The substrate 100 may include a glass material or a polymer resin. In an embodiment, the substrate 100 may include sub-layers. The sub-layers may have a structure in which an organic layer and an inorganic layer are alternately stacked. In case that the substrate 100 includes a polymer resin, the substrate 100 may include polyethersulfone, polyacrylate, polyetherimide, polyethylene naphthalate, polyethylene terephthalate, polyphenylene sulfide, polyarylate, polyimide, polycarbonate, or cellulose acetate propionate.

A display layer 200 including a display element such as an organic light-emitting diode, and a thin-film encapsulation layer (not shown) covering the display layer may be arranged on the substrate 100. Hereinafter, the display layer will be described in detail.

A buffer layer 201 may be formed on the substrate 100 to prevent impurities from penetrating into a semiconductor layer Act of a thin-film transistor TFT. The buffer layer 201 may include an inorganic insulating material such as silicon nitride, silicon oxide, and silicon oxynitride and may include a single layer or a multilayer including the inorganic insulating material.

The pixel circuit PC may be arranged on the buffer layer 201. The pixel circuit PC may be arranged to correspond to each pixel P. The pixel circuit PC includes the thin-film transistor TFT and a storage capacitor Cst. The thin-film transistor TFT may include the semiconductor layer Act, a gate electrode GE, a source electrode SE, and a drain electrode DE.

Although not shown in FIG. 8, a data line DL of the pixel circuit PC may be electrically connected to a switching thin-film transistor included in the pixel circuit PC. Although the embodiment of FIG. 8 illustrates a top-gate type thin-film transistor TFT in which the gate electrode GE is arranged over the semiconductor layer Act with a gate insulating layer 203 therebetween, the thin-film transistor TFT may include a bottom-gate type thin-film transistor in another embodiment.

In an embodiment, the semiconductor layer Act may include an oxide semiconductor. In another embodiment, the semiconductor layer Act may include amorphous silicon, polysilicon, an organic semiconductor, or the like.

The gate electrode GE may include a low resistance metal material. The gate electrode GE may include a conductive material including molybdenum (Mo), aluminum (Al), copper (Cu), or titanium (Ti) and may include a single layer or a multilayer including the above material.

The gate insulating layer 203 between the semiconductor layer Act and the gate electrode GE may include an inorganic insulating material such as silicon oxide, silicon oxynitride, silicon nitride, aluminum oxide, titanium oxide, tantalum oxide, and hafnium oxide. The gate insulating layer 203 may be a single layer or a multilayer including the above-described material.

The source electrode SE and the drain electrode DE may be located on a same layer as the data line DL and may include a same material. The source electrode SE, the drain electrode DE, and the data line DL may include a material having excellent conductivity. The source electrode SE and the drain electrode DE may each include a conductive material including Mo, Al, Cu, or Ti and may include a single layer or a multilayer including the above material. For example, the source electrode SE, the drain electrode DE, and the data line DL may each include a multilayer of Ti/Al/Ti.

The storage capacitor Cst may include a first electrode CE1 and a second electrode CE2 overlapping each other with a first interlayer insulating layer 205 therebetween. The storage capacitor Cst may overlap the thin-film transistor TFT. In this regard, FIG. 8 illustrates that the gate electrode GE of the thin-film transistor TFT serves as the first electrode CE1 of the storage capacitor Cst. In another embodiment, the storage capacitor Cst may not overlap the thin-film transistor TFT. The storage capacitor Cst may be covered with a second interlayer insulating layer 207. The second electrode CE2 of the storage capacitor Cst may include a conductive material including Mo, Al, Cu, or Ti and may include a single layer or a multilayer including the above material.

The first interlayer insulating layer 205 and the second interlayer insulating layer 207 may each include an inorganic insulating material such as silicon oxide, silicon oxynitride, silicon nitride, aluminum oxide, titanium oxide, tantalum oxide, or hafnium oxide. The first interlayer insulating layer 205 and the second interlayer insulating layer 207 may each include a single layer or a multilayer including the above material.

The pixel circuit PC including the thin-film transistor TFT and the storage capacitor Cst may be covered with a first planarization insulating layer 208. An upper surface of the first planarization insulating layer 208 may include an approximately flat surface.

Although not shown, a third interlayer insulating layer (not shown) may be further arranged under the first planarization insulating layer 208. The third interlayer insulating layer may include an inorganic insulating material such as silicon oxide, silicon nitride, or silicon oxynitride.

The pixel circuit PC may be electrically connected to a first electrode 210. For example, as shown in FIG. 5, a contact metal layer CM (see FIG. 8) may be between the thin-film transistor TFT and the first electrode 210. The contact metal layer CM may be electrically connected to the thin-film transistor TFT through a contact hole formed in the first planarization insulating layer 208, and the first electrode 210 may be electrically connected to the contact metal layer CM through a contact hole formed in a second planarization insulating layer 209 on the contact metal layer CM. The contact metal layer CM may include a conductive material including Mo, Al, Cu, or Ti and may include a single layer or a multilayer including the above material. In an embodiment, the contact metal layer CM may include a multilayer of Ti/Al/Ti.

The first planarization insulating layer 208 and the second planarization insulating layer 209 may each include an organic insulating material such as a general-purpose polymer such as polymethylmethacrylate (PMMA) or polystyrene (PS), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. In an embodiment, the first planarization insulating layer 208 and the second planarization insulating layer 209 may each include polyimide.

The first to third organic light-emitting diodes OLED1, OLED2, and OLED3 may be arranged on the second planarization insulating layer 209. As an example, each of the first to third organic light-emitting diodes OLED1, OLED2, and OLED3 may have a tandem structure as described above with reference to FIG. 5.

Each of the first to third organic light-emitting diodes OLED1, OLED2, and OLED3 may include a first electrode 210, a first common layer 221, a first emission layer 222a, a charge generation layer 224, a second emission layer 222b, a second common layer 223, and a second electrode 230 (see FIG. 5). In the first to third organic light-emitting diodes OLED1, OLED2, and OLED3, the first electrode 210, the first emission layer 222a, and the second emission layer 222b are patterned and provided for each pixel, and the first common layer 221, the second common layer 223, the charge generation layer 224, and the second electrode 230 may each be provided as one body in a display area.

In FIG. 8, the first to third organic light-emitting diodes OLED1, OLED2, and OLED3 having the above-described stacked structure of an organic light-emitting diode of FIG. 5 is used as an example. For the first to third organic light-emitting diodes OLED1, OLED2, and OLED3, the stacked structure of a second electrode 230 of FIG. 6 or FIG. 7 may also be used.

The first electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 210 may include a reflective layer including Ag, Mg, Al, Pt, Pd, Au, Ni, Nd, Ir, Cr, or a compound thereof. In yet another embodiment, the first electrode 210 may further include a film including ITO, IZO, ZnO, or $In_2O_3$ over and/or under the reflective film.

A pixel-defining layer 215 may be formed on the first electrode 210. The pixel-defining layer 215 may include an opening exposing an upper surface of the first electrode 210 and may cover edges of the first electrode 210. In an embodiment, the pixel-defining layer 215 may include an organic insulating material. In another embodiment, the pixel-defining layer 215 may include an inorganic insulating material such as a silicon nitride, a silicon oxynitride, or a silicon oxide. In yet another embodiment, the pixel-defining layer 215 may include an organic insulating material and an inorganic insulating material.

The interlayer 220 includes two or more emission layers (e.g., the first emission layer 222a and the second emission layer 222b). Each of the first emission layer 222a and the second emission layer 222b may include a polymer organic material or a low-molecular weight organic material emitting light having a certain color.

The interlayer 220 may include the first common layer 221 between the first emission layer 222a and the first electrode 210 and/or the second common layer 223 between the second emission layer 222b and the second electrode 230.

The first common layer 221 may include a single layer or a multilayer. For example, when the first common layer 221 includes a polymer material, the first common layer 221 may include a hole transport layer (HTL), which has a single-layer structure, and may include PEDOT or polyaniline (PAN). When the first common layer 221 includes a low-molecular weight material, the first common layer 221 may include a hole injection layer (HIL) and an HTL.

The second common layer 223 may be omitted. For example, when the first common layer 221, the first emission layer 222a, and the second emission layer 222b include a polymer material, the second common layer 223 may be formed. The second common layer 223 may include a single layer or a multilayer. The second common layer 223 may include an electron transport layer (ETL) and/or an electron injection layer (EIL).

The charge generation layer 224 may be between the first emission layer 222a and the second emission layer 222b. The charge generation layer 224 may include the n-type charge generation layer n-CGL and the p-type charge generation layer p-CGL (see FIG. 5).

The second electrode 230 may include a first conductive layer 231, a second conductive layer 232, and a third conductive layer 233 sequentially stacked. The first conductive layer 231 may be arranged on the second common layer 223, for example, on the electron injection layer EIL as shown in FIG. 4 or FIG. 5. The second conductive layer 232 may be disposed between the first conductive layer 231 and the third conductive layer 233.

The first conductive layer 231, the second conductive layer 232, and the third conductive layer 233 may each be provided as one body over the first to third organic light-emitting diodes OLED1, OLED2, and OLED3. The first common layer 221, the second common layer 223, and the second electrode 230 may each be formed on a front surface of the substrate 100 by using a thermal deposition method.

FIG. 8 illustrates that, as described above with reference to FIG. 6, the second electrode 230 includes the first conductive layer 231, the second conductive layer 232, and the third conductive layer 233. However, the structure of FIG. 8 may have a structure of the second electrode 230 as illustrated in FIG. 7. The first conductive layer 231, the second conductive layer 232, and the third conductive layer 233 may each be the same as those described above with reference to FIG. 6.

In an embodiment, a capping layer 240 may be located on the second electrode 230. For example, the capping layer 240 may include a single layer or a multilayer including a material selected from among an organic material, an inorganic material, and a mixture thereof. In another embodiment, a lithium fluoride (LiF) layer may be located on the capping layer 240.

Because the first to third organic light-emitting diodes OLED1, OLED2, and OLED3 may be damaged by external moisture or oxygen, a thin-film encapsulation layer 300 may cover and protect the first to third organic light-emitting diodes OLED1, OLED2, and OLED3. The thin-film encapsulation layer 300 may cover a display area DA and may extend to a non-display area outside the display area DA. The thin-film encapsulation layer 300 may include at least one organic encapsulation layer and at least one inorganic encapsulation layer. For example, the thin-film encapsulation layer 300 may include a first inorganic encapsulation layer 310, an organic encapsulation layer 320, and a second inorganic encapsulation layer 330.

The first inorganic encapsulation layer 310 may cover the second electrode 230 and may include silicon oxide, silicon nitride, and/or silicon oxynitride. Because the first inorganic encapsulation layer 310 is formed along an underlying structure thereof, an upper surface of the first inorganic encapsulation layer 310 may not be flat. The organic encapsulation layer 320 may cover the first inorganic encapsulation layer 310. Unlike the first inorganic encapsulation layer 310, an upper surface of the organic encapsulation layer 320 may be substantially flat. In an embodiment, an upper surface of the organic encapsulation layer 320 may be substantially flat in a portion corresponding to the display area DA. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, hexamethyldisiloxane, and acrylic resin (e.g., polymethyl methacrylate, polyacrylic acid, etc.). The second inorganic encapsulation layer 330 may cover the organic encapsulation layer 320 and may include silicon oxide, silicon nitride, and/or silicon oxynitride.

Even in case that the thin-film encapsulation layer 300 cracks, the above-described multilayer structure of the thin-film encapsulation layer 300 may prevent the cracks from being connected between the first inorganic encapsulation layer 310 and the organic encapsulation layer 320 or between the organic encapsulation layer 320 and the second inorganic encapsulation layer 330. Therefore, the formation of a passage through which external moisture or oxygen penetrates into the display area DA may be prevented or minimized.

A filler 610 may be arranged on the thin-film encapsulation layer 300. The filler 610 may function as a buffer against external pressure or the like. The filler 610 may include an organic material such as methyl silicone, phenyl silicone, or polyimide. However, embodiments are not limited thereto, and the filler 610 may include an organic sealant such as a urethane-based resin, an epoxy-based resin, or an acrylic resin, or an inorganic sealant such as silicon.

A light-shielding layer 620 may be arranged on the thin-film encapsulation layer 300. The light-shielding layer 620 may be directly arranged on the second inorganic encapsulation layer 330 of the thin-film encapsulation layer 300. The light-shielding layer 620 may be arranged to correspond to a black matrix 510 to be described below and may include a light-shielding material that may be used in the black matrix 510.

An anti-reflective layer 500 may be provided under the upper substrate 700 and arranged to face the substrate 100 with the filler 610 therebetween. The anti-reflective layer 500 may include the black matrix 510, color filters 520R, 520G, and 520B, first and second color conversion layers QD1 and QD2, a transmission layer TL, and a partition wall 530.

Each of the first and second color conversion layers QD1 and QD2 may include quantum dots. The quantum dots exhibit excitation and emission characteristics according to material and size, and thus may convert incident light into light having a certain color. Various materials may be used as the quantum dots.

In an embodiment, the quantum dots may have a core-shell structure including a core including nanocrystals and a shell surrounding the core. The core of quantum dots may be selected from among a Group II-VI compound, a Group III-VI compound, a Group IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle as the concentration distribution is divided into partially different states. The quantum dots may have a core-shell structure in which one quantum dot surrounds another quantum dot. An interface between the core and the shell may have a concentration gradient in which an element concentration in the shell gradually decreases toward the center.

The shell of the quantum dot may function as a protective layer for maintaining semiconductor characteristics by preventing chemical transformation of the core and/or may function as a charging layer for imparting electrophoretic characteristics to the quantum dots. The shell may include a single layer or a multilayer. An interface between the core and the shell may have a concentration gradient in which an element concentration in the shell gradually decreases toward the center. Examples of the shell of the quantum dot may include a metal oxide, a non-metal oxide, a semiconductor compound, or a combination thereof.

For example, examples of the metal oxide or the non-metal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, etc.; or a ternary compound such as $MgAl_2O_4$, $CoFe_2O_4$, $NiFe_2O_4$, $CoMn_2O_4$, etc., but embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dots may have a full width of half maximum (FWHM) of an emission wavelength spectrum equal to or less than about 45 nm. For example, the quantum dots may have a FWHM of an emission wavelength spectrum equal to or less than about 40 nm. For example, the quantum dots may have a FWHM of an emission wavelength spectrum equal to or less than about 30 nm. Color purity or color reproducibility may be improved within these ranges. Light emitted through these quantum dots may be emitted in all directions, and thus an optical field of view may be improved.

Forms of the quantum dots are not limited to forms used in the art. For example, the quantum dots may have forms of spherical, pyramidal, multi-arm, or cubic nanoparticles, nanotubes, nanowires, nanofibers, or nanoplate-shaped particles.

The quantum dots may adjust a color of emitted light according to a particle size thereof, and thus the quantum dots may have various emission colors such as blue, red, green, etc.

The core of the quantum dots may have a diameter in a range of about 2 nm to about 10 nm, and when the quantum dots are exposed to light, the quantum dots may emit light having a specific wavelength depending on the size of particles and the type of material. Thus, an average size of quantum dots included in the first color conversion layer QD1 may be different from an average size of quantum dots included in the second color conversion layer QD2. For example, as the size of the quantum dots increases, color light having a longer wavelength may be emitted. Accordingly, the size of the quantum dots may be selected according to colors of the first pixel Pr and the second pixel Pg.

In addition to the quantum dots, the first and second color conversion layers QD1 and QD2 may further include various materials so that the quantum dots are mixed and appropriately dispersed. For example, the first and second color conversion layers QD1 and QD2 may further include scattering particles, a solvent, a photoinitiator, a binder polymer, a dispersant, and the like.

A color conversion layer may not be correspondingly provided in an emission area EA of the third pixel Pb, but a transmission layer TL may be arranged therein. The transmission layer TL may be provided as an organic material through which light may be emitted without conversion of a wavelength of light emitted from the third organic light-emitting diode OLED3 of the third pixel Pb. The transmission layer TL may include scattering particles for uniform color spreadability. In an embodiment, the scattering particles may have a diameter in a range of about 200 nm to about 400 nm.

In the embodiment illustrated in FIG. 8, the first organic light-emitting diode OLED1 and the second organic light-emitting diode OLED2 respectively included in the first pixel Pr and the second pixel Pg may emit light having a same wavelength, and colors of the first pixel Pr and the second pixel Pg may be determined as colors of light emitted by the quantum dots of the first color conversion layer QD1 and the quantum dots of the second color conversion layer QD2.

The color conversion layer is not provided to correspond to the emission area EA of the third pixel Pb, and thus a color of the third pixel Pb may be determined as a color of light emitted by the third organic light-emitting diode OLED3. For example, the first pixel Pr may implement red light, the second pixel Pg may implement green light, and the third pixel Pb may implement blue light.

The partition wall 530 may be between the first color conversion layer QD1 and the second color conversion layer QD2, and between the second color conversion layer QD2 and the transmission layer TL to correspond to a non-emission area NEA. For example, the partition wall 530 may be between the first color conversion layer QD1 and the second color conversion layer QD2, and between the second color conversion layer QD2 and the transmission layer TL.

In an embodiment, the partition wall 530 may include an organic material, and a material to control optical density, such as CR or $CrO_x$, $Cr/CrO_x$, $Cr/CrO_x/CrN_y$, resin (carbon pigment, RGB mixed pigment, etc.), graphite, or a non-Cr-based material. In another embodiment, the partition wall 530 may include a pigment having a red, green, or yellow color. The partition wall 530 may serve as a black matrix to prevent color mixing and to improve visibility.

First to third color filters 520R, 520G, and 520B and the black matrix 510 may be provided between the upper substrate 700, and the first and second color conversion layers QD1 and QD2 and the transmission layer TL.

The first to third color filters 520R, 520G, and 520B may be included to implement a full color image, and to improve color purity and outdoor visibility. The first to third color filters 520R, 520G, and 520B may absorb stray light (for example, lower light that is not color-converted by quantum dots) which has passed through the first and second color conversion layers QD1 and QD2 without having its wavelength changed in the first and second color conversion layers QD1 and QD2 and to transmit only light having a desired wavelength. For example, light having passed through the first color filter 520R may emit red light, light having passed through the second color filter 520G may emit green light, and light having passed through the third color filter 520B may emit blue light.

The black matrix 510 may be between the first to third color filters 520R, 520G, and 520B to correspond to the non-emission area NEA. The black matrix 510 may improve color sharpness and contrast. The black matrix 510 may include at least one of a black pigment, a black dye, or black particles. In embodiments, the black matrix 510 may include a material such as Cr or $CrO_X$, $Cr/CrO_X$, $Cr/CrO_X/CrN_Y$, a resin (carbon pigment, RGB mixed pigment), graphite, or a non-Cr based material.

Color filters arranged adjacent to each other among the first to third color filters 520R, 520G, and 520B may be arranged to overlap each other in the non-emission area NEA. Because color filters having different colors are provided to overlap each other, the light blocking rate may be improved. In embodiments, the color filters 520R, 520G, and 520B, and the black matrix 510 may be omitted.

Figure 10:
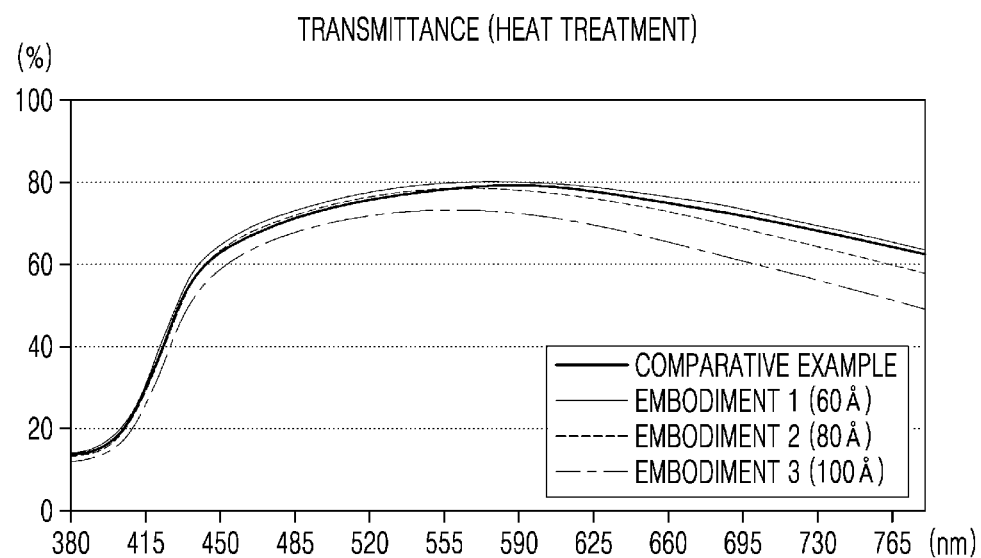
FIG. 10 is a graph obtained by measuring transmittance in a comparative example and embodiments.
Figure 11:
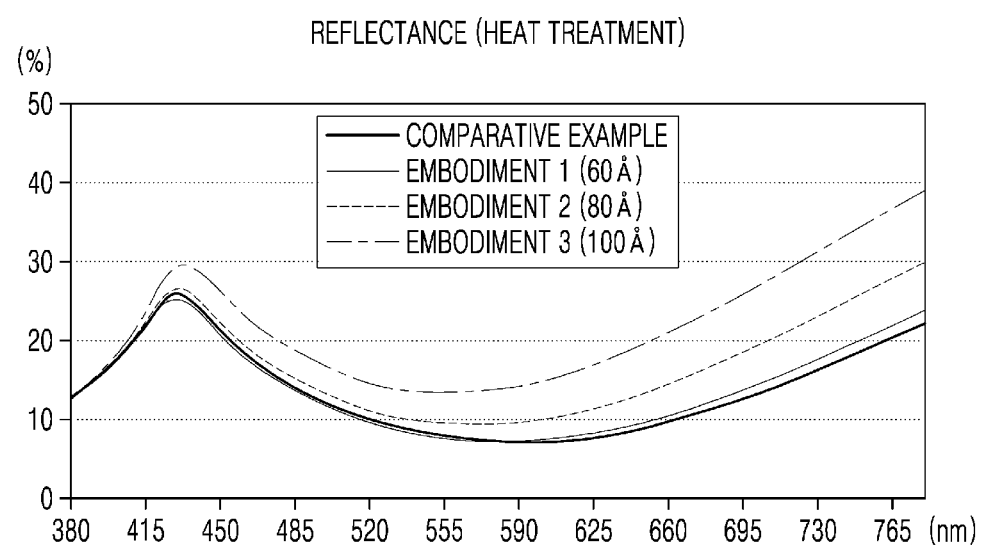
FIG. 11 is a graph obtained by measuring reflectance in a comparative example and embodiments.
Figure 12:
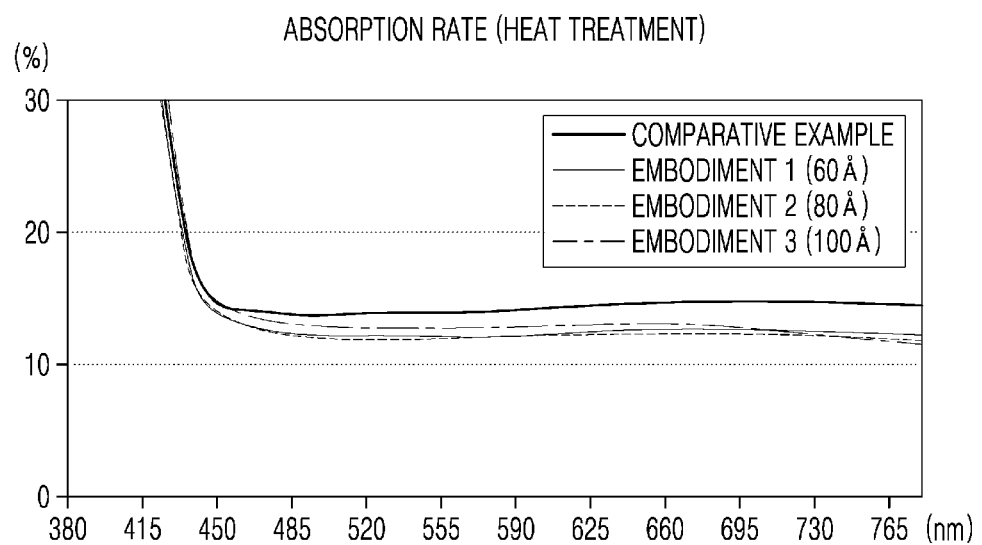
FIG. 12 is a graph obtained by measuring absorption rate in a comparative example and embodiments.
Figure 13:
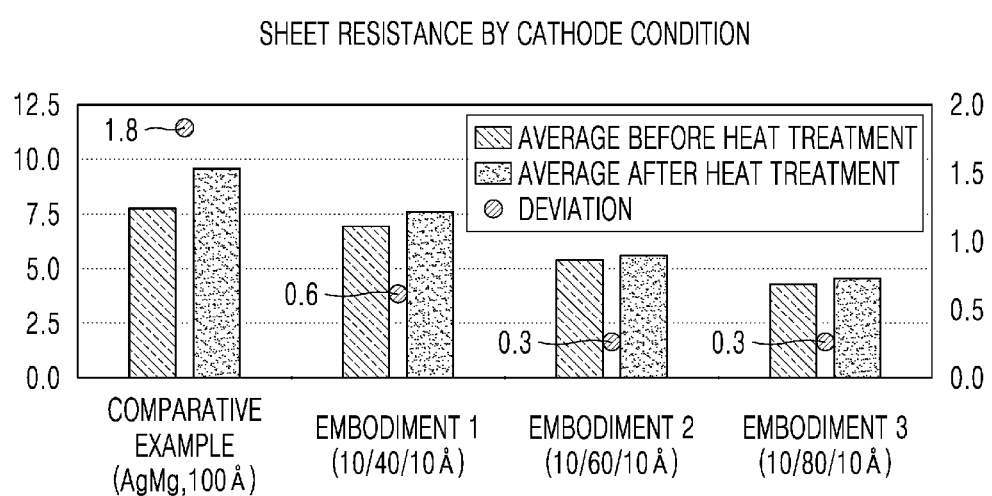
FIG. 13 is a graph obtained by measuring sheet resistance and high temperature reliability in a comparative example and embodiments.

FIG. 9 is a table obtained by measuring light transmittance, reflectance, and absorption rate for a multilayer electrode to which an embodiment of the disclosure is applied and a multilayer electrode to which a comparative example is applied, FIG. 10 is a graph obtained by measuring transmittance in a comparative example and embodiments, FIG. 11 is a graph obtained by measuring reflectance in a comparative example and embodiments, FIG. 12 is a graph obtained by measuring absorption rate in a comparative example and embodiments, and FIG. 13 is a graph obtained by measuring sheet resistance and high temperature reliability in a comparative example and embodiments.

In FIGS. 9 to 13, samples, to which a single layer electrode structure or a multilayer electrode structure is applied after an electron transport layer ETL and an electron injection layer EIL are sequentially stacked on a glass substrate, were used for evaluation. In FIGS. 9 to 13, the notation of "X1:X2" indicates "base metal:additive metal". In the case of Comparative Example, an Ag:Mg single layer was deposited and evaluated, and in the case of Embodiments 1 to 3, a multilayer structure of Ag:Mg/Ag/Ag:Mg was deposited and evaluated.

Comparative Example discloses an electrode layer with a thickness of 100 Å, which includes an Ag:Mg alloy, as a single layer.

Embodiments 1, 2, and 3 are embodiments to which a multilayer electrode structure according to an embodiment of the disclosure is applied, and disclose a structure in which a first conductive layer including an Ag:Mg alloy, a second conductive layer including pure silver (Ag), and a third conductive layer including an Ag:Mg alloy are stacked. Embodiments 1 to 3 each represent a case in which a first base metal, a second base metal, and a single metal material are Ag and first and second additive metals are Mg. In Embodiments 1 to 3, the thickness of the first conductive layer is equal to the thickness of the third conductive layer, but the thickness of the second conductive layer is different from the thicknesses of the first and third conductive layers. In Embodiment 1, the thickness of the first conductive layer, the thickness of the second conductive layer, and the thickness of the third conductive layer are 10 Å, 40 Å, and 10 Å, respectively (total thickness 60 Å). In Embodiment 2, the thickness of the first conductive layer, the thickness of the second conductive layer, and the thickness of the third conductive layer are 10 Å, 60 Å, and 10 Å, respectively (total thickness 80 Å). In Embodiment 3, the thickness of the first conductive layer, the thickness of the second conductive layer, and the thickness of the third conductive layer are 10 Å, 80 Å, and 10 Å, respectively (total thickness 100 Å).

The table of FIG. 9 shows results obtained by measuring transmittance (T), reflectance (R), and absorption rate (A) in different wavelength ranges (e.g., 450 nm, 550 nm, and 650 nm), respectively.

Referring to FIGS. 9 and 10, in terms of transmittance (T), Embodiments 1 and 2 exhibit results at levels almost equal to those of Comparative Example, or improved results in a short wavelength region.

Referring to FIGS. 9 and 11, it may be confirmed that reflectance (R) of Embodiments 1 to 3 increased by up to 10% compared to that of Comparative Example.

Referring to FIGS. 9 and 12, it may be confirmed that absorption rate (A) of Embodiments 1 to 3 each using a multilayer structure decreased by up to −2.1% compared to that of Comparative Example using a single-layer structure including Mg as a whole. This is because Mg corresponding to the first additive metal and the second additive metal has a property of absorbing light.

As such, in the case of Embodiments 1 to 3 to which a multilayer structure according to an embodiment of the disclosure is applied, the absorption rate (A) decreases and the reflectance (R) increases, compared to Comparative Example, and accordingly, out-coupling efficiency may increase.

Referring to FIGS. 9 and 13, the average value of sheet resistance before heat treatment and the average value of sheet resistance after heat treatment of Comparative Examples and Embodiments 1 to 3 were measured. In the case of Comparative Example, a sheet resistance deviation before and after heat treatment is 1.8, indicating that the sheet resistance after heat treatment is significantly increased compared to before heat treatment. On the other hand, in the case of Embodiment 1, a sheet resistance deviation before and after heat treatment is 0.6, and in the case of Embodiments 2 and 3, a sheet resistance deviation before and after heat treatment is 0.3. In the case of Embodiments 1 to 3, it may be confirmed that a sheet resistance deviation before and after heat treatment is very small. The sheet resistance deviation in Embodiments 1 to 3 is about ⅓ or less of the sheet resistance deviation in Comparative Example, and thus, it may be determined that the multilayer electrodes of Embodiments 1 to 3 have better thermal stability than the single-layer electrode of Comparative Example.

FIG. 14 is a table comparing the pixel efficiency of a comparative example to the pixel efficiencies of embodiments of the disclosure, and FIG. 15 is a table comparing the pixel efficiencies of comparative examples to the pixel efficiencies of embodiments of the disclosure.

The table of FIG. 14 shows pixel efficiencies for a red sub-pixel (R), a green sub-pixel (G), and a blue sub-pixel (B) with respect to Comparative Example and Embodiments 1 to 5, and values obtained by summing the pixel efficiencies. Comparative Example, Embodiment 1, Embodiment 2, and Embodiment 3 of FIG. 14 are the same as Comparative Example, Embodiment 1, Embodiment 2, and Embodiment 3, respectively, described with reference to FIG. 9. Embodiments 4 and 5 are different from Embodiments 1 to 3 in the thickness of the second conductive layer including pure silver (Ag). The second conductive layers in Embodiments 1 to 5 were formed to have different thicknesses, which are 40 Å, 60 Å, 80 Å, 100 Å, and 120 Å, respectively.

The pixel efficiency of Comparative Example is 53.4, and compared to this, the pixel efficiency of Embodiment 1 increased by +3.2%, the pixel efficiency of Embodiment 2 increased by +3.6%, the pixel efficiency of Embodiment 3 increased by +2.8%, and the pixel efficiency of Embodiment 4 increased by +0.7%. The pixel efficiency of Embodiment 5 is at the same level as that of Comparative Example. Through this, it may be determined that, when the thickness of the second conductive layer including a single metal material exceeds 120 Å, pixel efficiency is reduced due to a decrease in transmittance of the multilayer electrode (i.e., the cathode or second electrode).

Referring to FIG. 15, the pixel efficiencies of Comparative Examples 1 to 4 and the pixel efficiencies of Embodiments 2 and 3 are shown. Embodiments 2 and 3 in FIG. 15 are the same as Embodiments 2 and 3 described with reference to FIG. 9.

In Comparative Example 1, as a single layer including an Ag:Mg alloy, an Ag-rich electrode was formed by adding Ag 95% and Mg 5% by volume, and in Comparative Example 2, as a single layer including an Mg:Ag alloy, a magnesium-rich electrode was formed by adding Ag 10% and Mg 90% by volume. Comparative Examples 3 and 4 each have a multilayer structure in which a first conductive layer including an Mg:Ag alloy, a second conductive layer including pure Ag, and a third conductive layer including an Mg:Ag alloy are stacked, and the multilayer structure was manufactured to have a magnesium-rich characteristic. Comparative Examples 3 and 4 were evaluated by substituting Ag:Mg of the first conductive layer and the third conductive layer in Embodiments 2 and 3 with Mg:Ag.

When the pixel efficiency of Comparative Example 1 is 53.4, compared to this, the pixel efficiency of Embodiment 2 increased by +3.6%, and the pixel efficiency of Example 3 increased by +2.8%. On the other hand, the pixel efficiency of Comparative Example 2 including a magnesium-rich layer decreased by −4.5%, the pixel efficiency of Comparative Example 3 decreased by −0.4%, and the pixel efficiency of Comparative Example 4 decreased by −1.7%.

Based on the experimental results of FIG. 15, as in Comparative Examples 2 to 4, it may be determined that, when the volume amount of the additive metal is greater than that of the base metal (for example, in the case of an electrode structure including a magnesium-rich layer), the pixel efficiency is lower than those of Comparative Example 1 and is much lower than those of Embodiments 2 and 3.

According to the embodiments as described above, a light-emitting diode having low driving voltage, high efficiency, and long lifespan, and a display apparatus including the light-emitting diode may be implemented. However, the disclosure is not limited by the effects.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A display apparatus comprising:
  a first electrode on a substrate;
  a second electrode facing the first electrode; and
  an emission layer between the first electrode and the second electrode,
  wherein the second electrode includes:
    a first conductive layer including a first base metal and a first additive metal that is different from the first base metal;
    a second conductive layer on the first conductive layer and including a single metal material; and
    a third conductive layer on the second conductive layer and including a second base metal and a second additive metal that is different from the second base metal.

2. The display apparatus of claim 1, wherein the first base metal includes at least one of Ag, Au, Cu, Al, Mg, and a metal having an electrical conductivity equal to or greater than about $1\times10^7$ S/m.

3. The display apparatus of claim 1, wherein the first additive metal includes at least one of Mg, Ca, Li, Au, Al, Yb, Cu, Sm, and a metal having a work function equal to or less than about 3 eV.

4. The display apparatus of claim 1, wherein the single metal material includes at least one of Ag, Au, Cu, Al, Mg, and a metal having an electrical conductivity equal to or greater than about $1\times10^7$ S/m.

5. The display apparatus of claim 1, wherein a thickness of the first conductive layer is less than a thickness of the second conductive layer.

6. The display apparatus of claim 1, wherein a thickness of the first conductive layer is in a range of about 5 Å to about 30 Å.

7. The display apparatus of claim 1, wherein a thickness of the second conductive layer is in a range of about 40 Å to about 120 Å.

8. The display apparatus of claim 1, wherein the second electrode has a plurality of stacked structures each including the first conductive layer and the second conductive layer.

9. The display apparatus of claim 1, wherein a volume ratio of the first base metal to the first additive metal is in a range of about 99:1 to about 1:1.

10. The display apparatus of claim 1, wherein the second base metal includes at least one of Ag, Au, Cu, Al, Mg, and a metal having an electrical conductivity equal to or greater than about $1\times10^7$ S/m.

11. The display apparatus of claim 1, wherein the second additive metal includes at least one of Mg, Ca, Li, Au, Al, Yb, Cu, Sm, and a metal having a work function equal to or less than about 3 eV.

12. The display apparatus of claim 1, wherein the third conductive layer includes a same material as the first conductive layer.

13. The display apparatus of claim 1, wherein a thickness of the third conductive layer is less than a thickness of the second conductive layer.

14. The display apparatus of claim 1, wherein a thickness of the third conductive layer is in a range of about 5 Å to about 30 Å.

15. The display apparatus of claim 1, wherein a volume ratio of the second base metal to the second additive metal is in a range of about 99:1 to about 1:1.

16. The display apparatus of claim 1, wherein a thickness ratio of the first conductive layer to the second conductive layer to the third conductive layer is about 1:6:1.

17. A light-emitting diode comprising:
  a first electrode;
  a second electrode facing the first electrode; and
  an emission layer between the first electrode and the second electrode,
  wherein the second electrode includes:
    a first conductive layer including a first base metal and a first additive metal that is different from the first base metal;
    a second conductive layer on the first conductive layer and including a single metal material; and a third conductive layer on the second conductive layer and including a second base metal and a second additive metal that is different from the second base metal.

18. The light-emitting diode of claim 17, wherein the first base metal includes at least one of Ag, Au, Cu, Al, Mg, and a metal having an electrical conductivity equal to or greater than about $1\times10^7$ S/m.

19. The light-emitting diode of claim 17, wherein the first additive metal includes at least one of Mg, Ca, Li, Au, Al, Yb, Cu, Sm, and a metal having a work function equal to or less than about 3 eV.

20. The light-emitting diode of claim 17, wherein a thickness of the first conductive layer is less than a thickness of the second conductive layer.

21. The light-emitting diode of claim 17, wherein a volume ratio of the first base metal to the first additive metal is in a range of about 99:1 to about 1:1.

22. The light-emitting diode of claim 17, wherein the second base metal includes at least one of Ag, Au, Cu, Al, Mg, and a metal having an electrical conductivity equal to or greater than about $1\times10^7$ S/m.

23. The light-emitting diode of claim 17, wherein the second additive metal includes at least one of Mg, Ca, Li, Au, Al, Yb, Cu, Sm, and a metal having a work function equal to or less than about 3 eV.

24. The light-emitting diode of claim 17, wherein a thickness of the first conductive layer is less than a thickness of the third conductive layer.

25. The light-emitting diode of claim 17, wherein a volume ratio of the second base metal to the second additive metal is in a range of about 99:1 to about 1:1.

26. The light-emitting diode of claim 17, wherein the single metal material includes at least one of Ag, Au, Cu, Al, Mg, and a metal having an electrical conductivity equal to or greater than about $1\times10^7$ S/m.

27. The light-emitting diode of claim 17, wherein a thickness ratio of the first conductive layer to the second conductive layer to the third conductive layer is about 1:6:1.

28. A multilayer electrode comprising:
a first conductive layer including a first base metal and a first additive metal that is different from the first base metal;
a second conductive layer on the first conductive layer and including a single metal material; and
a third conductive layer on the second conductive layer and including a second base metal and a second additive metal that is different from the second base metal.

* * * * *